(12) United States Patent
Sasanuma et al.

(10) Patent No.: US 11,966,132 B2
(45) Date of Patent: Apr. 23, 2024

(54) DISPLAY DEVICE

(71) Applicant: Japan Display Inc., Tokyo (JP)

(72) Inventors: Keita Sasanuma, Tokyo (JP); Kengo Shiragami, Tokyo (JP); Naoyuki Obinata, Tokyo (JP)

(73) Assignee: Japan Display Inc., Tokyo (JP)

( * ) Notice: Subject to any disclaimer, the term of this patent is extended or adjusted under 35 U.S.C. 154(b) by 424 days.

(21) Appl. No.: 17/479,206

(22) Filed: Sep. 20, 2021

(65) Prior Publication Data
US 2022/0004067 A1 Jan. 6, 2022

Related U.S. Application Data

(63) Continuation of application No. PCT/JP2020/002369, filed on Jan. 23, 2020.

(30) Foreign Application Priority Data

Mar. 25, 2019 (JP) ................. 2019-057256

(51) Int. Cl.
*G02F 1/1362* (2006.01)
*G01R 31/317* (2006.01)
*G02F 1/1345* (2006.01)
*G02F 1/1368* (2006.01)

(52) U.S. Cl.
CPC . *G02F 1/136254* (2021.01); *G01R 31/31713* (2013.01); *G02F 1/13456* (2021.01); *G02F 1/13452* (2013.01); *G02F 1/1368* (2013.01)

(58) Field of Classification Search
CPC .......... G02F 1/136254; G02F 1/13456; G01R 31/31713
See application file for complete search history.

(56) References Cited

U.S. PATENT DOCUMENTS

2014/0139509 A1 5/2014 Kim
2018/0031895 A1 2/2018 Koide et al.
2019/0064239 A1 2/2019 Lee et al.

FOREIGN PATENT DOCUMENTS

| CN | 107664883 A | 2/2018 |
| JP | 2005-062354 A | 3/2005 |
| JP | 2005-084535 A | 3/2005 |
| JP | 2010-243524 A | 10/2010 |

(Continued)

OTHER PUBLICATIONS

German Office Action from corresponding German Patent Application No. 112020000928.9, dated Sep. 27, 2023, with English Translation. 5 pages.

(Continued)

*Primary Examiner* — Anthony Ho
(74) *Attorney, Agent, or Firm* — K&L Gates LLP

(57) ABSTRACT

A display device includes signal lines, first driver terminals that are provided in a first peripheral region and to which a first driver IC can be coupled, second driver terminals to which a second driver IC can be coupled, a plurality of inspection terminals provided in the first peripheral region, first inspection switches coupled to the first driver terminals and configured to be capable of switching coupling and interruption of the inspection terminals and the signal lines, and second inspection switches coupled to the second driver terminals and configured to be capable of switching coupling and interruption of the inspection terminals and the signal lines.

7 Claims, 9 Drawing Sheets

(56) References Cited

FOREIGN PATENT DOCUMENTS

JP       2011-197377 A     10/2011
JP       2013-182128 A     9/2013

OTHER PUBLICATIONS

International Search Report issued in International Patent Application No. PCT/JP2020/002369 dated Apr. 7, 2020 and English translation of same. 5 pages.
Written Opinion issued in International Patent Application No. PCT/JP2020/002369 dated Apr. 7, 2020. 3 pages.
Office Action issued in related Chinese Patent Application No. 202080022810.0 dated Sep. 30, 2022 and English translation of same. 11 pages.

FIG.7
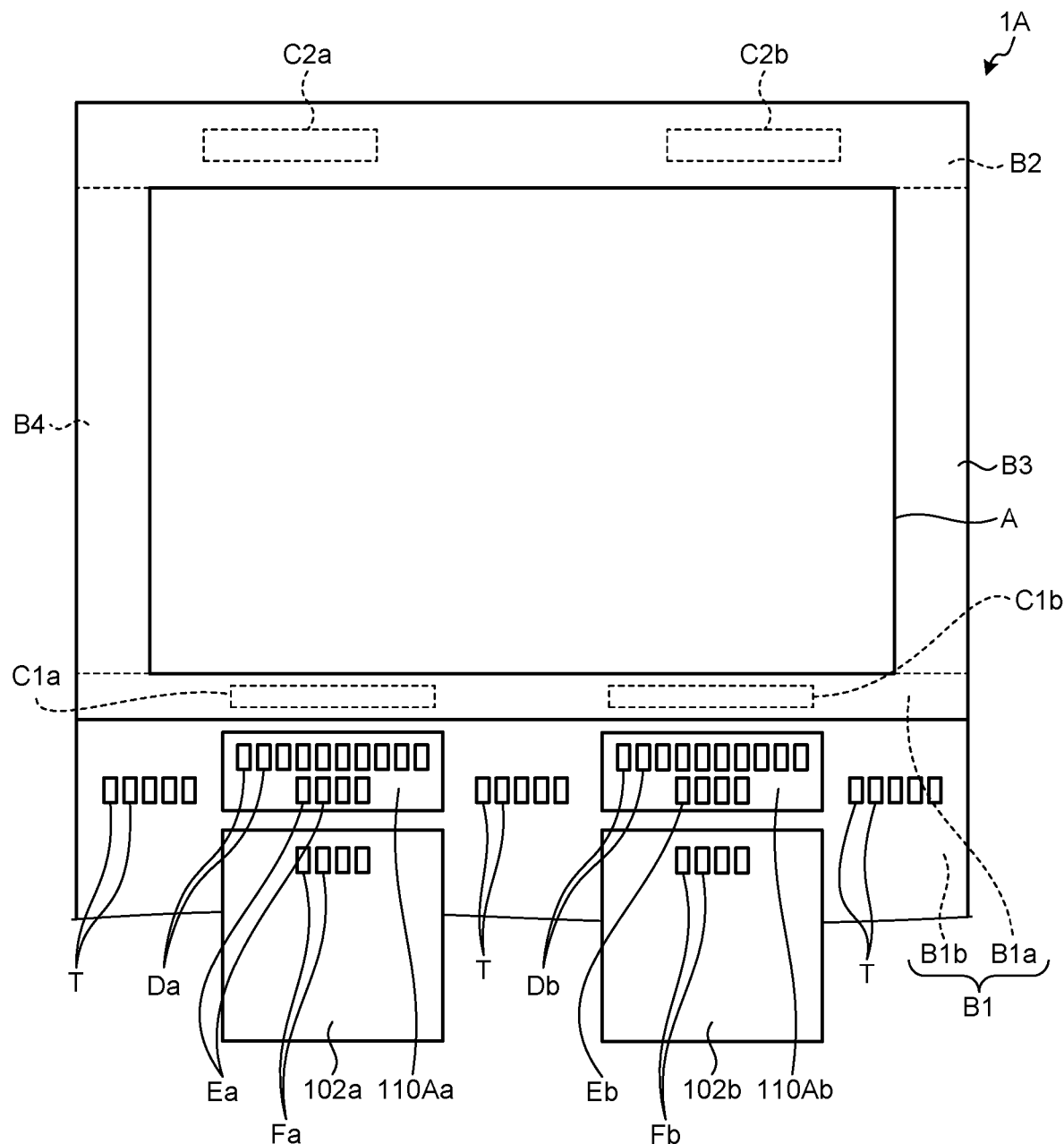
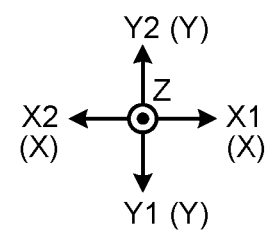

FIG.9
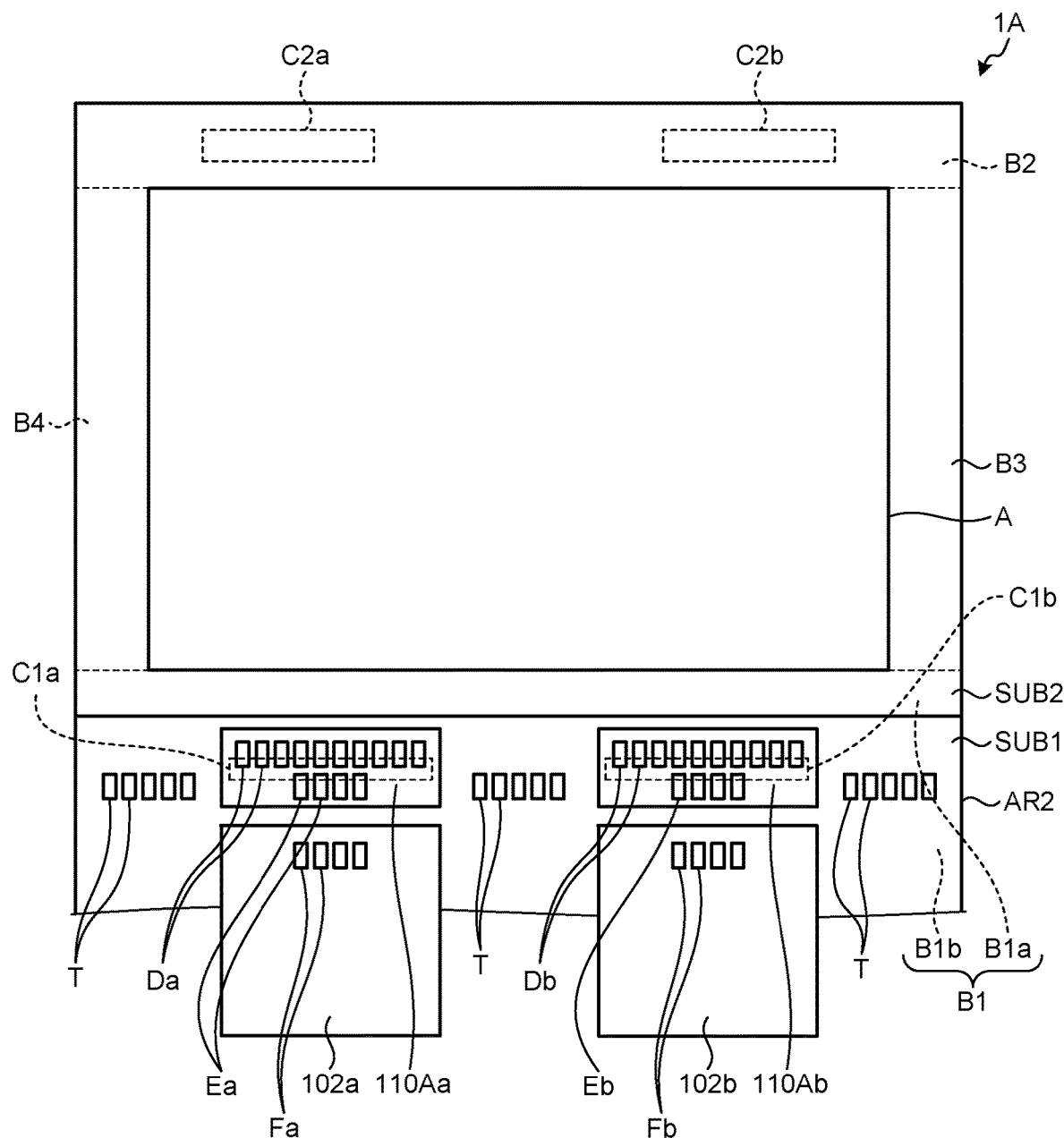
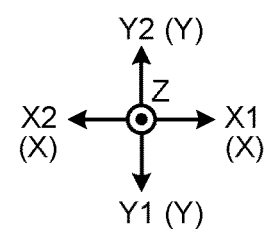

DISPLAY DEVICE

CROSS-REFERENCE TO RELATED APPLICATION(S)

This application is a continuation of PCT international application Ser. No. PCT/JP2020/002369 filed on Jan. 23, 2020 which designates the United States, incorporated herein by reference, and which claims the benefit of priority from Japanese Patent Application No. 2019-057256, filed on Mar. 25, 2019, incorporated herein by reference.

BACKGROUND

1. Technical Field

The present disclosure relates to a display device.

2. Description of the Related Art

Various techniques of inspecting a display device have been studied in order to ensure reliability of the display device. For example, Japanese Patent Application Laid-open Publication No. 2010-243524 describes that inspection terminals coupled through an inspection circuit to signal lines coupled to pixels are provided in a display device. Japanese Patent Application Laid-open Publication No. 2010-243524 describes that a coloring state is inspected by inputting an inspection data signal to the inspection circuit through the inspection terminals to cause the pixels to make color development in accordance with the inspection data signal.

A plurality of driver ICs can be mounted on a large-sized display device, for example, and in this case, a plurality of inspection circuits are also mounted so as to correspond to the driver ICs. In this case, concerns are increased that current flowing as inspection data signals through the inspection circuits is imbalanced among the inspection circuits. Imbalance of the potentials of the inspection data signals among the inspection circuits causes unevenness in luminance of pixels in the inspection, resulting in lowering of inspection accuracy. Accordingly, prevention of lowering in reliability has been desired by preventing the inspection accuracy of the display device from being lowered.

The present disclosure has been made in view of the above-mentioned problem, and an object thereof is to provide a display device capable of preventing lowering of reliability.

SUMMARY

A display device according to an embodiment of the present disclosure comprising: a first substrate having a display region in which a plurality of pixels are provided and a peripheral region on an outer side of the display region; wiring provided in the display region and coupled to the pixels to supply a signal to the pixels; a first driver terminal that is provided in a first peripheral region being the peripheral region on a first direction side of the display region and is coupled to the wiring and to which a first driver IC is capable of being coupled; a second driver terminal that is provided at a position aligned with the first driver terminal in a direction intersecting with the first direction in the first peripheral region and is coupled to the wiring and to which a second driver IC is capable of being coupled; a plurality of inspection terminals provided in the first peripheral region; a first inspection switch coupled to the first driver terminal and configured to be capable of switching coupling and interruption of the inspection terminal and the wiring; and a second inspection switch coupled to the second driver terminal and configured to be capable of switching coupling and interruption of the inspection terminal and the wiring, wherein the inspection terminals are provided in a first region on a side of the first driver terminal that is opposite to a side of the second driver terminal, a second region on a side of the second driver terminal that is opposite to the side of the first driver terminal, and a third region between the first driver terminal and the second driver terminal.

BRIEF DESCRIPTION OF THE DRAWINGS

FIG. 7 is a plan view schematically illustrating a display device according to a modification.

FIG. 9 is a plan view schematically illustrating a display device according to another modification.

DETAILED DESCRIPTION OF THE PREFERRED EMBODIMENTS

Figure 1:
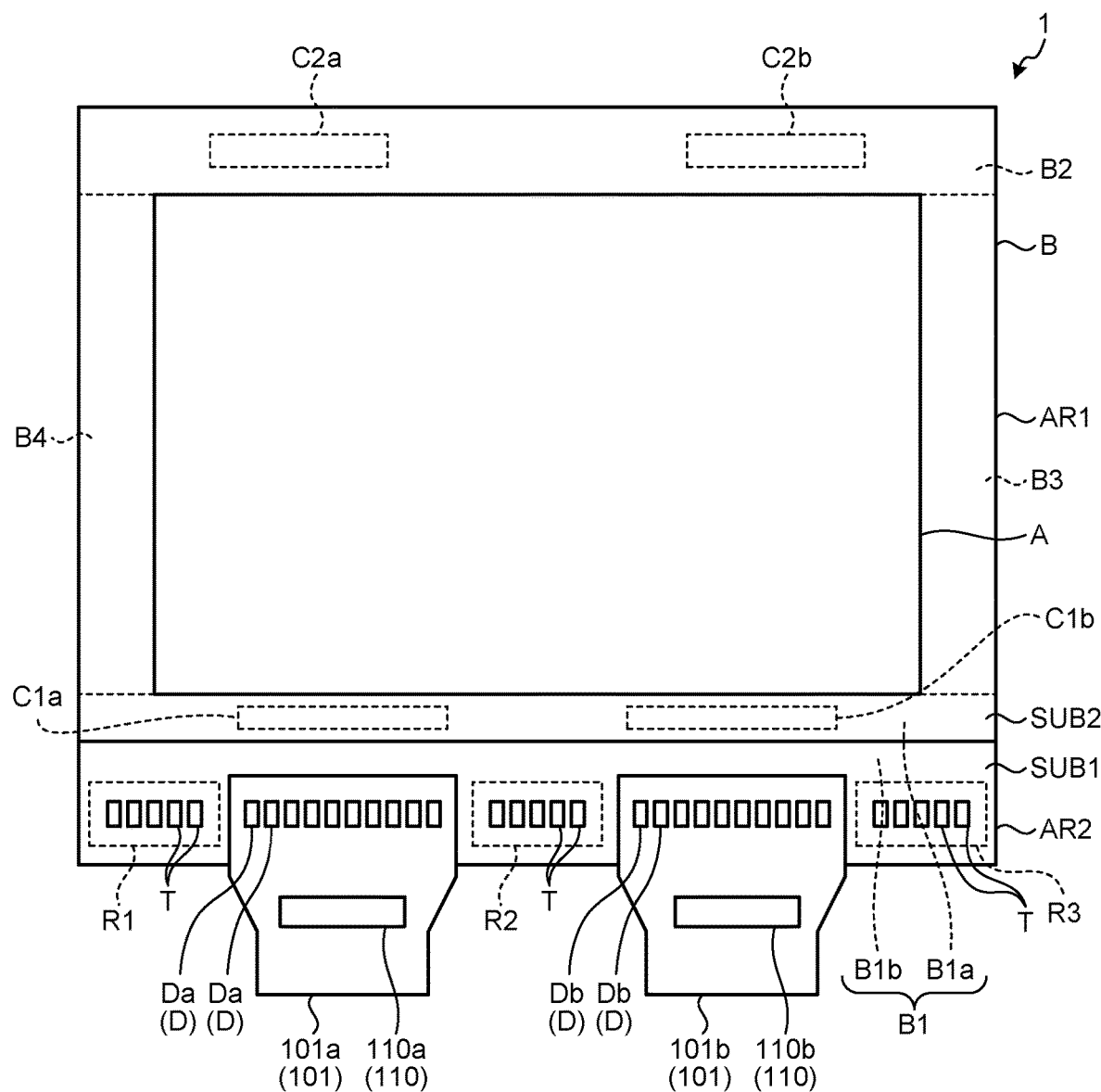
FIG. 1 is a plan view schematically illustrating a display device according to the embodiment.

Hereinafter, an embodiment of the present disclosure will be described with reference to the drawings. What is disclosed herein is merely an example, and it is needless to say that appropriate modifications within the gist of the disclosure at which those skilled in the art can easily arrive are encompassed in the range of the present disclosure. In the drawings, widths, thicknesses, shapes, and the like of the components can be schematically illustrated in comparison with actual modes for clearer explanation. They are however merely examples and do not limit the interpretation of the present disclosure. In the present specification and the drawings, the same reference numerals denote components similar to those described before with reference to the drawing that has been already referred, and detail explanation thereof can be appropriately omitted.

Configuration of Display Device

FIG. 1 is a plan view schematically illustrating a display device according to the embodiment. As illustrated in FIG. 1, a display device 1 in the embodiment includes a first substrate SUB1 as an array substrate and a second substrate SUB2 as a counter substrate. Hereinafter, a direction parallel with the surfaces of the first substrate SUB1 and the second substrate SUB2 is a direction X. A direction parallel with the surfaces of the first substrate SUB1 and the second substrate SUB2 and intersecting with the direction X, in this example, a direction orthogonal to the direction X is a direction Y. A direction of the direction Y toward one side is a first direction Y1, and a direction of the direction Y toward the other side, that is, an opposite direction to the first direction Y1 is a second direction Y2. Similarly, a direction of the direction X toward one side is a third direction X1, and a direction of the direction X toward the other side, that is, an opposite direction to the third direction X1 is a fourth direction X2. A direction orthogonal to the direction X and the direction Y, that is, a direction orthogonal to the surfaces of the first substrate SUB1 and the second substrate SUB2 is a direction Z.

The first substrate SUB1 and the second substrate SUB2 are stacked in the direction Z. The first substrate SUB1 has a larger area than that of the second substrate SUB2. The first substrate SUB1 and the second substrate SUB2 are stacked such that a portion of the first substrate SUB1 on the first direction Y1 side protrudes to the first direction Y1 side rather than the second substrate SUB2 when seen from the direction Z. That is to say, the display device 1 has a superimposition region AR1 in which the first substrate SUB1 and the second substrate SUB2 are superimposed with each other and a protrusion region AR2 in which no second substrate SUB2 is provided and only the first substrate SUB1 is provided. The protrusion region AR2 is adjacent to the superimposition region AR1 on the first direction Y1 side.

The display device 1 has a display region A and a peripheral region B. The display region A is a region in which a plurality of pixels are arranged and images are displayed. The peripheral region B is a region in which no pixel is arranged and no image is displayed. The peripheral region B is a region on the outer side of the display region A when seen from the Z direction. In the embodiment, the peripheral region B has a frame shape surrounding the display region A and can also be referred to as a frame region. The display region A is provided in the superimposition region AR1 in which the first substrate SUB1 and the second substrate SUB2 are superimposed with each other. The peripheral region B is a region in the first substrate SUB1. More specifically, a part of the peripheral region B is provided in the superimposition region AR1, and another part thereof is provided in the protrusion region AR2. That is to say, the peripheral region B is provided in the superimposition region AR1 to the protrusion region AR2. Accordingly, it is regarded that the first substrate SUB1 has the display region A and the peripheral region B, and more specifically, the first substrate SUB1 is divided into the display region A and the peripheral region B.

The peripheral region B has a first peripheral region B1, a second peripheral region B2, a third peripheral region B3, and a fourth peripheral region B4. The first peripheral region B1 is the peripheral region B on the first direction Y1 side of the display region A. The second peripheral region B2 is the peripheral region B on the second direction Y2 side of the display region A, in other words, the peripheral region B on the opposite side to the first peripheral region B1 with respect to the display region A. The third peripheral region B3 is the peripheral region B on the third direction X1 side of the display region A. The fourth peripheral region B4 is the peripheral region B on the fourth direction X2 side of the display region A, in other words, the peripheral region B on the opposite side to the third peripheral region B3 with respect to the display region A.

The first peripheral region B1 is provided in the superimposition region AR1 to the protrusion region AR2 on the first direction Y1 side of the superimposition region AR1. That is to say, the first peripheral region B1 includes an inner peripheral region B1a located in the superimposition region AR1 and an outer peripheral region Bib located in the protrusion region AR2. The second peripheral region B2, the third peripheral region B3, and the fourth peripheral region B4 are located in the superimposition region AR1. That is to say, the superimposition region AR1 is occupied by the display region A, the inner peripheral region B1a, the second peripheral region B2, the third peripheral region B3, and the fourth peripheral region B4, and the protrusion region AR2 is occupied by the outer peripheral region B1b.

Wiring substrates 101a and 101b are provided in the outer peripheral region Bib of the first peripheral region B1. The wiring substrates 101a and 101b are configured by flexible printed circuits (FPCs), for example. A driver integrated circuit (IC) 110a is provided on the wiring substrate 101a, and a driver IC 110b is provided on the wiring substrate 101b. Each of the driver ICs 110a and 110b includes a control circuit that controls display of the display device 1, a detection circuit, and an analog front end. That is to say, in the embodiment, the driver ICs 110a and 110b are respectively mounted on the wiring substrates 101a and 101b by chip on film (COF) (hereinafter, referred to as "COF mounting"). The wiring substrate 101a and the driver IC 110a and the wiring substrate 101b and the driver IC 110b are aligned in the direction X. That is to say, the wiring substrate 101b is located on the third direction X1 side of the wiring substrate 101a and the driver IC 110a, and the driver IC 110b is located on the third direction X1 side of the wiring substrate 101a and the driver IC 110a in the embodiment. Hereinafter, when the wiring substrates 101a and 101b are not distinguished from each other, they are referred to as a wiring substrate 101, and when the driver ICs 110a and 110b are not distinguished from each other, they are referred to as a driver IC 110. It is sufficient that the display device 1 has a configuration capable of being coupled to the wiring substrate 101 and the driver IC 110, and the display device 1 may have a configuration that does not include the wiring substrate 101 and the driver IC 110. Alternatively, the display device 1 may have a configuration that includes the wiring substrate 101 and the driver IC 110.

The display device 1 further has a plurality of first driver terminals Da, a plurality of second driver terminals Db, and a plurality of inspection terminals T provided in the peripheral region B. In the embodiment, the first driver terminals Da, the second driver terminals Db, and the inspection terminals T are provided in the first peripheral region B1, and more specifically, provided in the outer peripheral region B1b.

The first driver terminals Da are terminals capable of being coupled to the driver IC 110a. The first driver terminals Da are terminals for supplying various signals output from the coupled driver IC 110a to wiring (signal lines S, which will be described later) of the display device 1. The second driver terminals Db are terminals capable of being coupled to the driver IC 110b. The second driver terminals Db are terminals for supplying various signals output from the coupled driver IC 110b to the wiring (signal lines S, which will be described later) of the display device 1. The first driver terminals Da are provided so as to correspond to the driver IC 110a, and the second driver terminals Db are provided so as to correspond to the driver IC 110b. Accordingly, the first driver terminals Da and the second driver terminals Db are aligned in the direction X. The second driver terminals Db are located on the third direction X1 side of the first driver terminals Da in the embodiment. In other words, a region in which the second driver terminals Db are provided is located on the third direction X1 side of a region in which the first driver terminals Da are provided.

The inspection terminals T are terminals for performing inspection of the wiring, in this example, aging processing and lighting inspection, which will be described later. The aging processing and the lighting inspection will be described later. The inspection terminals T are provided in a first region R1, a second region R2, and a third region R3 in the first peripheral region B1 (in this example, the outer peripheral region B1b). The first region R1 indicates a region on the side of the first driver terminals Da that is opposite to the side of the second driver terminals Db. That is to say, the first region R1 is a region located on the fourth direction X2 side of the region in which the first driver terminals Da are provided. The second region R2 indicates a region on the side of the second driver terminals Db that is opposite to the side of the first driver terminals Da. That is to say, the second region R2 is a region located on the third direction X1 side of the region in which the second driver terminals Db are provided. The third region R3 is a region between the first driver terminals Da and the second driver terminals Db. That is to say, the third region R3 is a region between the region in which the first driver terminals Da are provided and the region in which the second driver terminals Db are provided in the X direction, in other words, is a region on the third direction X1 side of the region in which the first driver terminals Da are provided and on the fourth direction X2 side of the region in which the second driver terminals Db are provided. The first region R1 is also regarded as a region of the driver IC 110a on the opposite side to the driver IC 110b side (region on the fourth direction X2 side of the driver IC 110a), the second region R2 is also regarded as a region of the driver IC 110b on the opposite side to the driver IC 110a side (region on the third direction X1 side of the driver IC 110b), and the third region R3 is also regarded as a region between the driver IC 110a and the driver IC 110b (region on the third direction X1 side of the driver IC 110a and on the fourth direction X2 side of the driver IC 110a).

The display device 1 includes a first inspection circuit C1a, a second inspection circuit C1b, a first coupling circuit C2a, and a second coupling circuit C2b as circuits for inspecting the wiring. The first inspection circuit C1a includes first inspection switches $SW_A$, which will be described later, and is coupled to the first driver terminals Da. The first inspection circuit C1a is coupled to the driver IC 110a through the first driver terminals Da. The second inspection circuit C1b includes second inspection switches $SW_B$, which will be described later, and is coupled to the second driver terminals Db. The second inspection circuit C1b is coupled to the driver IC 110b through the second driver terminals Db. The first inspection circuit C1a and the second inspection circuit C1b are provided in the first peripheral region B1, and they are provided in the inner peripheral region B1a in the embodiment. The first inspection circuit C1a is provided so as to correspond to the first driver terminals Da, and the second inspection circuit C1b is provided so as to correspond to the second driver terminals Db. Accordingly, the first inspection circuit C1a and the second inspection circuit C1b are aligned in the direction X. The second inspection circuit C1b is located on the third direction X1 side of the first inspection circuit C1a in the embodiment.

The first coupling circuit C2a includes first coupling switches $SW_C$, which will be described later, and is coupled to the first inspection circuit C1a through the signal lines S, which will be described later. The second coupling circuit C2b includes second coupling switches $SW_D$, which will be described later, and is coupled to the second inspection circuit C1b through the signal lines S, which will be described later. The first coupling circuit C2a and the second coupling circuit C2b are provided in the second peripheral region B2. The first coupling circuit C2a and the second coupling circuit C2b are aligned in the direction X. The second coupling circuit C2b is located on the third direction X1 side of the first coupling circuit C2a in the embodiment. The circuit configurations of the first inspection circuit C1a, the second inspection circuit C1b, the first coupling circuit C2a, and the second coupling circuit C2b will be described later.

Figure 2:
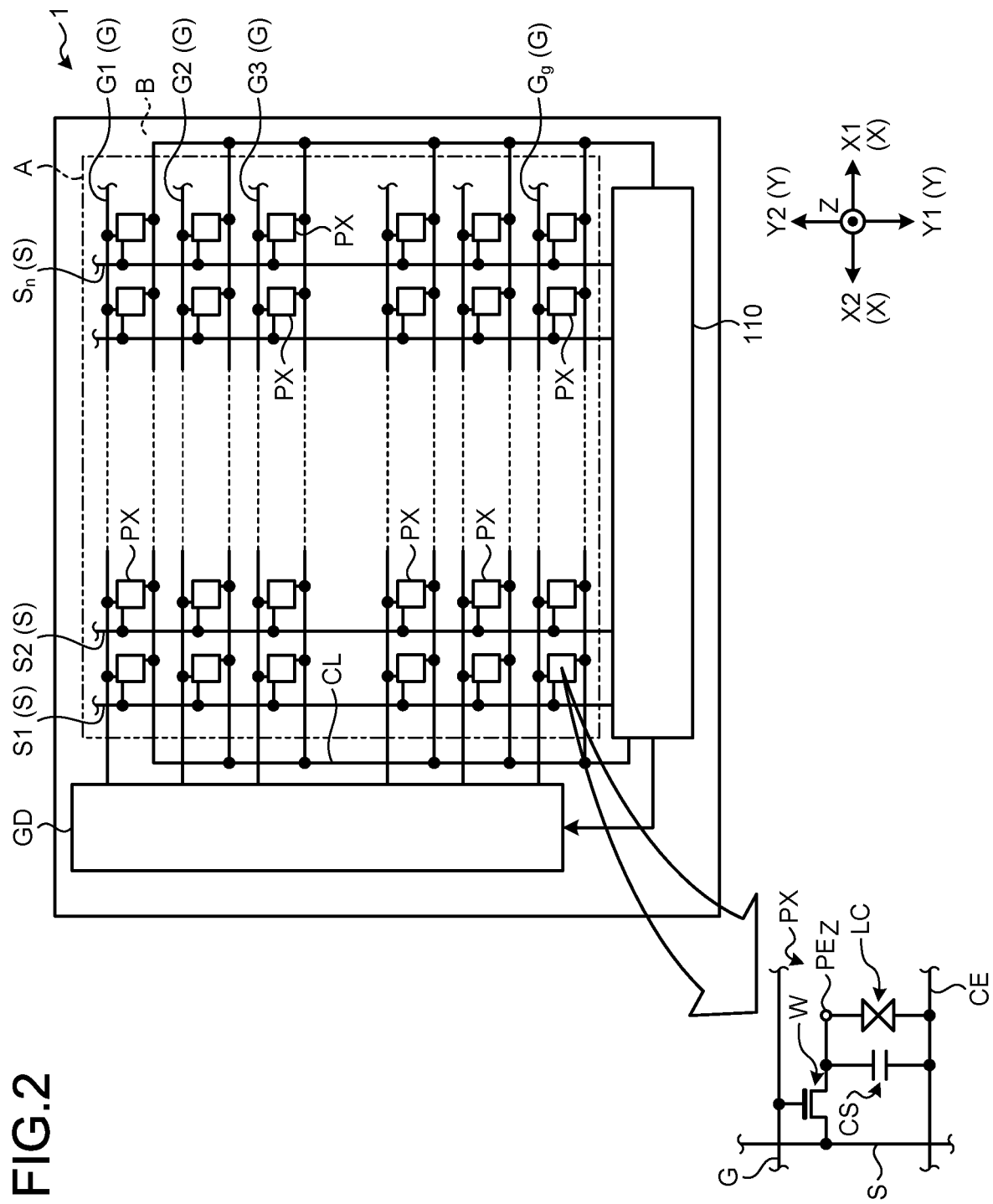
FIG. 2 is a schematic view illustrating pixel array of the display device in the embodiment.

FIG. 2 is a schematic view illustrating pixel array of the display device in the embodiment. As illustrated in FIG. 2, the display device 1 includes a plurality of pixels PX in the display region A. The pixels PX are arrayed in a matrix with a row-column configuration in the direction X and the direction Y. The display device 1 includes a plurality of lines of wiring in the display region A. The display device 1 includes g scan lines G (G1 to $G_g$), n signal lines S (S1 to $S_n$), and a common line CL as the wiring provided in the display region A. Both of g and n are integers of equal to or more than two. The scan lines G are coupled to a gate driver GD. Signals necessary for operations of the gate driver GD are supplied from the driver IC 110. The signal lines S and the common line CL are coupled to the driver IC 110. The scan lines G, the gate driver GD, the signal lines S, and the common line CL are formed on the first substrate SUB1 illustrated in FIG. 1.

Each of the pixels PX includes a switching element W, a pixel electrode PE, a common electrode CE, and a liquid crystal layer LC. The switching element W is formed by, for example, a thin film transistor (TFT) and is electrically coupled to the scan line G and the signal line S. The pixel electrode PE is electrically coupled to the switching element W. The common electrode CE is electrically coupled to the common line CL.

The gate driver GD outputs, to the scan lines G, control signals for making the switching elements W coupled to the scan lines G into conducting states. The driver IC 110 outputs video image signals to the signal lines S in a period in which the switching elements W are in the conducting states. Desired pixel potentials are thereby written into the pixel electrodes PE. The driver IC 110 supplies a common potential to the common line CL. The common electrodes CE thereby have the common potential. In each of the pixels PX, the pixel electrode PE faces the common electrode CE, the liquid crystal layer LC is driven with an electric field generated by potential difference between the pixel potential of the pixel electrode PE and the common potential of the common electrode CE. A holding capacitor CS is formed between an electrode having the same potential as that of the common electrode CE and an electrode having the same potential as that of the pixel electrode PE, for example.

Figure 3:
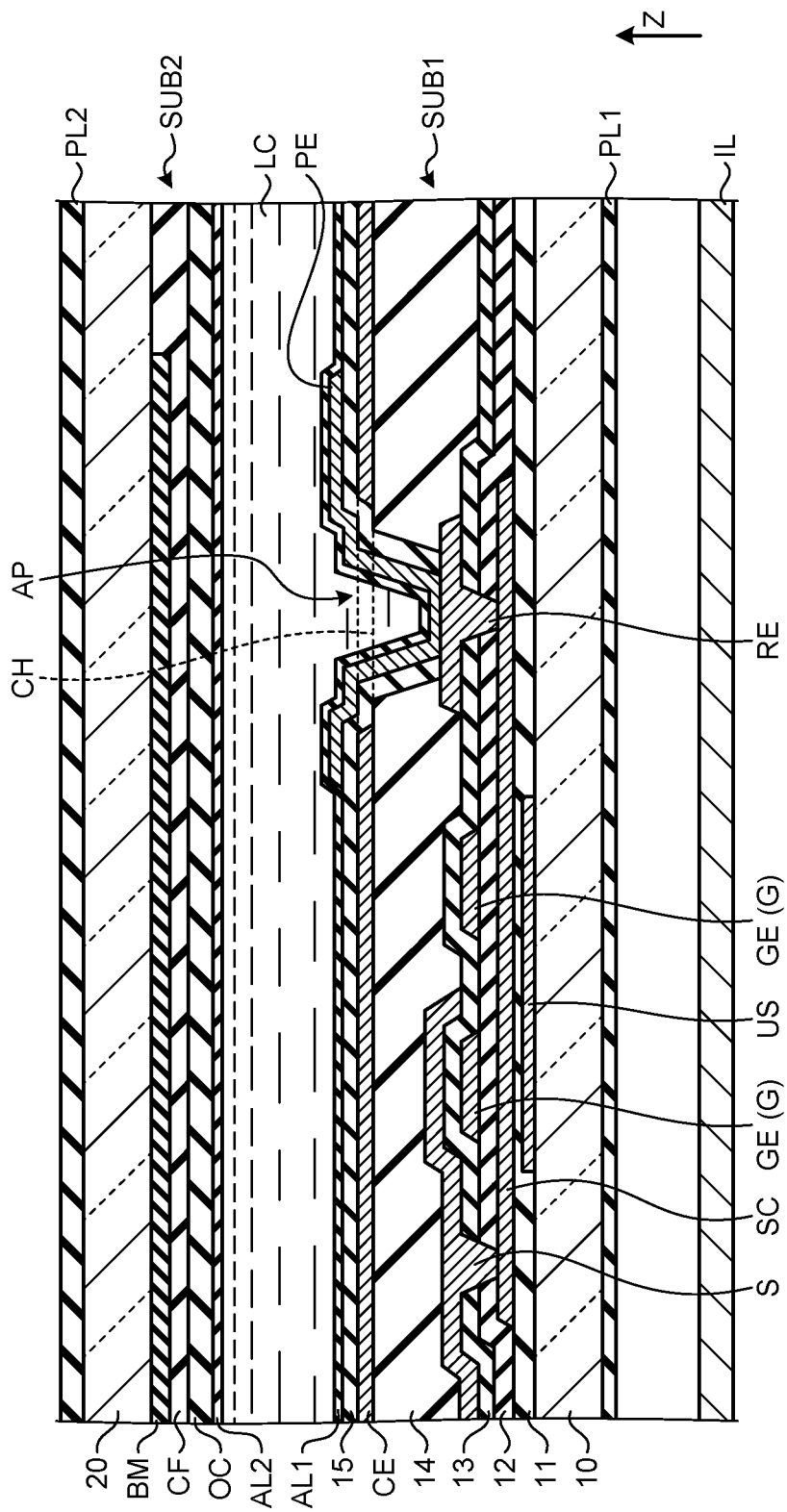
FIG. 3 is a schematic cross-sectional view of the display device in the embodiment.

FIG. 3 is a schematic cross-sectional view of the display device in the embodiment. As illustrated in FIG. 3, the display device 1 includes the first substrate SUB1 and the second substrate SUB2 that are stacked in the direction Z. The first substrate SUB1 includes an insulating substrate 10, insulating layers 11, 12, 13, 14, and 15, lower light shielding layers US, semiconductor layers SC, the scan lines G, the signal lines S, coupling electrodes RE, the common electrodes CE, the pixel electrodes PE, and an orientation film AL1. The insulating substrate 10 is a transparent substrate such as a glass substrate and a resin substrate. The lower light shielding layers US are located between the insulating substrate 10 and the insulating layer 11. The lower light shielding layers US are formed so as to be superimposed with both gate electrodes in the example illustrated in FIG. 3, but may be formed in a separated manner for the respective gate electrodes. The semiconductor layers SC are located between the insulating layer 11 and the insulating layer 12. The semiconductor layers SC are made of, for example, polycrystalline silicon but may be made of amorphous silicon or oxide semiconductor. Two gate electrodes GE as a part of the scan lines G are located between the insulating layer 12 and the insulating layer 13. The signal lines S and the coupling electrodes RE are located between the insulating layer 13 and the insulating layer 14. The signal lines S and the coupling electrodes RE make contact with the semiconductor layers SC. The common electrodes CE are located between the insulating layer 14 and the insulating layer 15. The pixel electrodes PE are located between the insulating layer 15 and the orientation film AL1. Parts of the pixel electrodes PE face the common electrodes CE with the insulating layer 15 interposed therebetween. The common electrodes CE and the pixel electrodes PE are made of a conductive material having translucency, such as indium tin oxide (ITO) and indium zinc oxide (IZO). The pixel electrodes PE make contact with the coupling electrodes RE through contact holes CH penetrating through the insulating layers 14 and 15 at positions superimposing with openings AP of the common electrodes CE. The insulating layers 11 to 13 and the insulating layer 15 are transparent inorganic insulating layers made of silicon oxide, silicon nitride, silicon oxynitride, or the like and may have a single layer structure or a multilayered structure. The insulating layer 14 is a transparent organic insulating layer made of acrylic resin or the like.

The second substrate SUB2 includes an insulating substrate 20, a light shielding layer BM, a color filter layer CF, an overcoat layer OC, and an orientation film AL2. The insulating substrate 20 is a transparent substrate such as a glass substrate and a resin substrate. The light shielding layer BM and the color filter CF are located between the insulating substrate 20 and the overcoat layer OC. The orientation film AL2 covers the overcoat layer OC.

The liquid crystal layer LC is located between the first substrate SUB1 and the second substrate SUB2 and is held between the orientation film AL1 and the orientation film AL2. The liquid crystal layer LC is made of a positive liquid crystal material (having a positive dielectric anisotropy) or a negative liquid crystal material (having a negative dielectric anisotropy). A polarizing plate PL1 is arranged under the first substrate SUB1 (on the opposite side to the second substrate SUB2). A polarizing plate PL2 is arranged above the second substrate SUB2 (on the opposite side to the first substrate SUB1). A retardation plate, a scattering layer, a reflection prevention layer, or the like may be included if necessary in addition to the polarizing plates PL1 and PL2. An illumination device IL is located under the polarizing plate PL1 (on the opposite side to the first substrate SUB1).

As described above, in the example of FIG. 3, the display device 1 is a liquid crystal display device in a transverse electric field mode, more specifically, a fringe field switching (FFS) mode. The display device 1 is not limited to employ the FFS mode and may be a desired display device in a longitudinal electric field mode or the like.

The display device 1 has a configuration for performing the inspection of the wiring. Hereinafter, the configuration for performing the inspection of the wiring will be described in detail.

Figure 4:
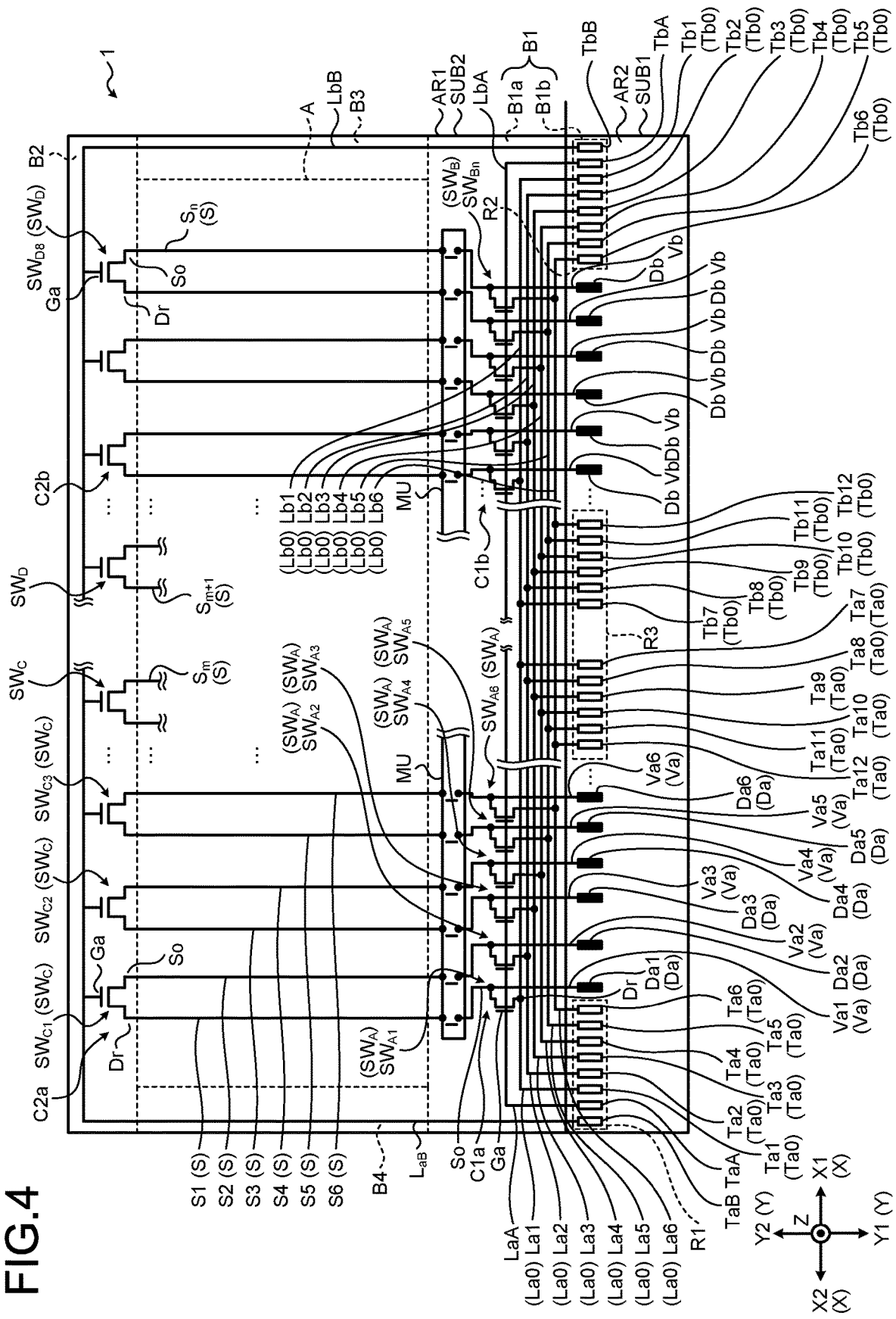
FIG. 4 is a schematic view illustrating the configuration of the display device in the embodiment.

FIG. 4 is a schematic circuit diagram illustrating the configuration of the display device in the embodiment. As illustrated in FIG. 4, the first driver terminals Da are coupled to the signal lines S as the wiring through video lines Va as wiring and a coupling circuit MU. Similarly, the second driver terminals Db are coupled to the signal lines S as the wiring through video lines Vb as wiring and the coupling circuit MU. Although FIG. 4 illustrates six first driver terminals Da and six second driver terminals Db as the first driver terminals Da and the second driver terminals Db for the convenience of explanation, the actual numbers of first driver terminals Da and second driver terminals Db may be more than six. First driver terminals Da1, Da2, Da3, Da4, Da5, and Da6 are coupled to the coupling circuit MU through respective video lines Va1, Va2, Va3, Va4, Va5, and Va6. Similarly, the second driver terminals Db are also coupled to the coupling circuit MU through the respective video lines Vb. The coupling circuits MU are provided on the second direction Y2 side of the first driver terminals Da and the second driver terminals Db and are located in the inner peripheral region B1a of the first peripheral region B1. Accordingly, the video lines Va and Vb are provided in the outer peripheral region B1b on the sides of the first driver terminals Da and the second driver terminals Db to the inner peripheral region B1a on the side of the coupling circuits MU. The first driver terminals Da and the second driver terminals Db are coupled to the different coupling circuits MU in the example of FIG. 4. The coupling manner is however not limited thereto, and the first driver terminals Da and the second driver terminals Db may be coupled to the same coupling circuit MU.

The coupling circuits MU are coupled to the video lines Va and Vb and the signal lines S and switch coupling between the video lines Va and Vb and the signal lines S. More specifically, the coupling wiring lines MU couple at least one signal line S selected from the signal lines S and the video line Va and couple at least one signal line S selected from the signal lines S and the video line Vb. The coupling circuit MU couples the signal line S1 to the video line Va1, that is, the first driver terminal Da1 in the embodiment. The coupling circuit MU couples the signal line S2 to the video line Va2, that is, the first driver terminal Da2. Similarly, the coupling circuit MU couples the video line Va3 (driver terminal Da3) and the signal line S3, couples the video line Va4 (driver terminal Da4) and the signal line S4, couples the video line Va5 (driver terminal Da5) and the signal line S5, and couples the video line Va6 (driver terminal Da6) and the signal line S6. Similarly, the coupling circuit MU couples the signal lines S to each of the video lines Vb, that is, each of the second driver terminals Db. Although 12 video lines V are illustrated for the convenience of explanation in the example of FIG. 4, the number of video lines V is not limited to 12.

As described above, the display device 1 has the configuration in which the first driver terminals Da and the second driver terminals Db are coupled to the signal lines S through the video lines Va and Vb and the coupling circuits MU. In the embodiment, the first driver terminals Da are coupled to any of the signal line S1 to the signal line $S_m$, and the second driver terminals Db are coupled to any of the signal line $S_{m+1}$ to the signal line $S_n$. Accordingly, when signals are output from the driver IC 110a in a state where the first driver terminals Da are coupled to the driver IC 110a, the signals from the driver IC 110a are output to the signal lines S (any of the signal line S1 to the signal line $S_m$) as video image signals through the first driver terminals Da, the video lines Va, and the coupling circuit MU. Similarly, when signals are output from the driver IC 110b in a state where the second driver terminals Db are coupled to the driver IC 110b, the signals from the driver IC 110b are output to the signal lines S (any of the signal line $S_{m+1}$ to the signal line $S_n$) as video image signals through the second driver terminals Db, the video lines Vb, and the coupling circuit MU.

The display device 1 includes the first inspection circuit C1a, the second inspection circuit C1b, the first coupling circuit C2a, and the second coupling circuit C2b in the first substrate SUB1. The first inspection circuit C1a includes the first inspection switches $SW_A$, and the second inspection circuit C1b includes the second inspection switches $SW_B$. The first coupling circuit C2a includes the first coupling switches $SW_C$, and the second coupling circuit C2b includes the second coupling switches $SW_D$. The first inspection switches $SW_A$, the second inspection switches $SW_B$, the first coupling switches $SW_C$, and the second coupling switches $SW_D$ are switching elements and are transistors in this example. The display device 1 includes, as the inspection terminals T, first switch terminals TaA and TaB, second switch terminals TbA and TbB, first inspection terminals Ta0, and second inspection terminals Tb0. The first switch terminals TaA and TaB are terminals for outputting gate signals to the first inspection switches $SW_A$ and the first coupling switches $SW_C$, and the second switch terminals TbA and TbB are terminals for outputting gate signals to the second inspection switches $SW_B$ and the second coupling switches $SW_D$. The first inspection terminals Ta0 and the second inspection terminals Tb0 are terminals for outputting inspection current to the signal lines S. Although 12 first inspection terminals Ta0 in total including a first inspection terminal Ta1 to a first inspection terminal Ta12 are provided in the embodiment, the number thereof is not limited to 12 and may be desirably set as long as the plurality of first inspection terminals are provided. Similarly, although 12 second inspection terminals Tb0 in total including a second inspection terminal Tb1 to a second inspection terminal Tb12 are provided in the embodiment, the number thereof is not limited to 12 and may be desirably set as long as the plurality of second inspection terminals are provided. The number of first inspection terminals Ta0 and the number of second inspection terminals Tb0 are preferably the same.

The first inspection terminals Ta0, the first switch terminals TaA and TaB, the first inspection switches $SW_A$, and the first coupling switches $SW_C$ are provided so as to correspond to the signal lines S (the signal line S1 to the signal line $S_m$) coupled to the first driver terminals Da and can be regarded as a first inspection unit that inspects the signal lines S coupled to the first driver terminals Da. Hereinafter, the respective components of the first inspection unit will be described.

Some of the first inspection terminals Ta0 as the inspection terminals are provided in the first region R1, and the others of the first inspection terminals Ta0 are provided in the third region R3. In the example of FIG. 4, the first inspection terminals Ta1, Ta2, Ta3, Ta4, Ta5, and Ta6 are provided in the first region R1, and the first inspection terminals Ta7, Ta8, Ta9, Ta10, Ta411, and Ta12 are provided in the third region R3. The first inspection terminals Ta0 are coupled to coupling lines La0 as the wiring. The coupling lines La0 extend to the inner peripheral region B1a from places in the outer peripheral region B1b in which they are coupled to the first inspection terminals Ta0 and extend in the third direction X1 in the inner peripheral region B1a. More specifically, the coupling lines La0 are coupled to both of the first inspection terminals Ta0 provided in the first region R1 and the first inspection terminals Ta0 provided in the third region R3. That is to say, in the example of FIG. 4, the first inspection terminal Ta1 and the first inspection terminal Ta7 are coupled to a coupling line La1, the first inspection terminal Ta2 and the first inspection terminal Ta8 are coupled to a coupling line La2, the first inspection terminal Ta3 and the first inspection terminal Ta9 are coupled to a coupling line La3, the first inspection terminal Ta4 and the first inspection terminal Ta10 are coupled to a coupling line La4, the first inspection terminal Ta5 and the first inspection terminal Ta11 are coupled to a coupling line La5, and the first inspection terminal Ta6 and the first inspection terminal Ta12 are coupled to a coupling line La6.

The first inspection switches $SW_A$ are provided. The first inspection switches $SW_A$ are provided in the first peripheral region B1 and are provided on the display region A side of the first driver terminals Da (the second direction Y2 side of the first driver terminals Da) in the first peripheral region B1. The first inspection switches $SW_A$ are provided in the inner peripheral region B1a in the embodiment. More specifically, the first inspection switches $SW_A$ may be provided at positions superimposing with the color filter layer CF when seen from the direction Z in the inner peripheral region B1a in which the first substrate SUB1 and the second substrate SUB2 are superimposed with each other. Furthermore, the first inspection switches $SW_A$ may be provided between the first region R1 and the third region R3 in the direction X.

The first inspection switches $SW_A$ are coupled to the coupling lines La0 and the video lines Va. That is to say, the first inspection switches $SW_A$ are coupled to the first inspection terminals Ta0 through the coupling lines La0. The first inspection switches $SW_A$ are coupled to the signal lines S (any of the signal line S1 to the signal line $S_m$) coupled to the first driver terminals Da through the video lines Va and are also regarded as being coupled to the first driver terminals Da through the video lines Va. To be specific, drain electrodes Dr of the first inspection switches $SW_A$ are coupled to the first inspection terminals Ta0 through the coupling lines La0. Source electrodes So of the first inspection switches $SW_A$ are coupled to the signal lines S (any of the signal line S1 to the signal line $S_m$) coupled to the first driver terminals Da and the first driver terminals Da through the video lines Va.

The first inspection switches $SW_A$ are provided, and first inspection switches $SW_{A1}$, $SW_{A2}$, $SW_{A3}$, $SW_{A4}$, $SW_{A5}$, and $SW_{A6}$ are provided in the example of FIG. 4. The drain electrode Dr of the first inspection switch $SW_{A1}$ is coupled to the coupling line La5, and the source electrode So thereof is coupled to the video line Va1. The drain electrode Dr of the first inspection switch $SW_{A2}$ is coupled to the coupling line La3, and the source electrode So thereof is coupled to the video line Va1. The drain electrode Dr of the first inspection switch $SW_{A3}$ is coupled to the coupling line La1, and the source electrode So thereof is coupled to the video line Va1. The drain electrode Dr of the first inspection switch $SW_{A4}$ is coupled to the coupling line La6, and the source electrode So thereof is coupled to the video line Va2. The drain electrode Dr of the first inspection switch $SW_{A5}$ is coupled to the coupling line La4, and the source electrode So thereof is coupled to the video line Va1. The drain electrode Dr of the first inspection switch $SW_{A6}$ is coupled to the coupling line La2, and the source electrode So thereof is coupled to the video line Va2. That is to say, the drain electrodes Dr of the first inspection switches $SW_A$ are coupled to any of the coupling lines La1, La2, La3, La4, La5, and La6, and the source electrodes So thereof are coupled to any of the video lines Va1 and Va2. The number of first inspection switches $SW_A$ is desirably set and is preferably the same as the number of signal lines S (the total number of the signal line S1 to the signal line $S_m$) coupled to the first driver terminals Da.

The first inspection terminals Ta0 in the first region R1 and the first inspection terminals Ta0 in the third region R3 are coupled to the coupling lines La0. Accordingly, the first inspection switches $SW_A$ are regarded as being coupled to the first inspection terminals Ta0 in the first region R1 and the first inspection terminals Ta0 in the third region R3 through the coupling lines La0. Coupling places of the first inspection switches $SW_A$ to the coupling lines La0 are located between coupling places of the first inspection terminals Ta0 provided in the first region R1 to the coupling lines La0 and coupling places of the first inspection terminals Ta0 provided in the third region R3 to the coupling lines La0. That is to say, the coupling places of the first inspection switches $SW_A$ to the coupling lines La0 are located on the third direction X1 side of the coupling places of the first inspection terminals Ta0 provided in the first region R1 to the coupling lines La0 and on the fourth direction X2 side of the coupling places of the first inspection terminals Ta0 provided in the third region R3 to the coupling lines La0.

The first switch terminal TaA is coupled to a coupling line LaA. The coupling line LaA extends to the inner peripheral region B1a from a place in the outer peripheral region B1b in which it is coupled to the first switch terminal TaA and extends in the third direction X1 in the inner peripheral region B1a. The coupling line LaA is coupled to the first inspection switches $SW_A$ in the inner peripheral region B1a. To be more specific, the coupling line LaA is coupled to gate electrodes Ga of the first inspection switches $SW_A$. That is to say, the gate electrodes Ga of the first inspection switches $SW_A$ are coupled to the first switch terminal TaA through the coupling line LaA. The coupling line LaA is coupled to each of the gate electrodes Ga of the first inspection switches $SW_A$, in FIG. 4, each of the gate electrodes Ga of the first inspection switches $SW_{A1}$, $SW_{A2}$, $SW_{A3}$, $SW_{A4}$, $SW_{A5}$, and $SW_{A6}$. That is to say, one coupling line LaA is coupled to each of the first inspection switches $SW_A$.

As described above, the drain electrodes Dr of the first inspection switches $SW_A$ are coupled to the first inspection terminals Ta0 through the coupling lines La0, the source electrodes So thereof are coupled to the signal lines S (any of the signal line S1 to the signal line $S_m$) coupled to the first driver terminals Da through the video lines Va, and the gate electrodes Ga thereof are coupled to the first switch terminal TaA through the coupling line LaA. Accordingly, when current (gate signal) is input to the gate electrodes Ga of the first inspection switches $SW_A$ through the first switch terminal TaA, the first inspection switches $SW_A$ electrically couple the coupling lines La0 and the video lines Va, that is, the first inspection terminals Ta0 and the signal lines S (any of the signal line S1 to the signal line $S_m$) coupled to the first driver terminals Da. On the other hand, in a state where no current (gate signal) is input to the gate electrodes Ga of the first inspection switches $SW_A$, the first inspection switches $SW_A$ electrically interrupt (disconnect) the coupling lines La0 and the video lines Va, that is, the first inspection terminals Ta0 and the signal lines S coupled to the first driver terminals Da. The first inspection switches $SW_A$ are thus configured to be capable of switching coupling and interruption of the first inspection terminals Ta0 and the signal lines S. More specifically, the first inspection switches $SW_A$ switch coupling and interruption of the first inspection terminals Ta0 and the signal lines S with the gate signal from the first switch terminal TaA.

The first coupling switches $SW_C$ as the coupling switches are provided in the second peripheral region B2. That is to say, the first coupling switches $SW_C$ are provided on the second direction Y2 side of the first inspection switches $SW_A$ provided in the first peripheral region B1 and the signal lines S provided in the display region A. Each first coupling switch $SW_C$ is coupled to the signal lines S coupled to the first driver terminals Da, and in the embodiment, it is coupled to two signal lines S (two of the signal line S1 to the signal line $S_m$) coupled to the first driver terminals Da. To be specific, the drain electrode Dr of each first coupling switch $SW_C$ is coupled to one signal line S of the two signal lines S coupled to the first driver terminals Da, and the source electrode So thereof is coupled to the other signal line S of the two signal lines S coupled to the first driver terminals Da. The first coupling switches $SW_C$ are preferably coupled to end portions of the signal lines S on the second direction Y2 side.

The first coupling switches $SW_C$ are provided, and in the example of FIG. 4, first coupling switches $SW_{C1}$, $SW_{C2}$, and $SW_{C3}$ are provided. The drain electrode Dr of the first coupling switch $SW_{C1}$ is coupled to the signal line S1, and the source electrode So thereof is coupled to the signal line S2. The drain electrode Dr of the first coupling switch $SW_{C2}$ is coupled to the signal line S3, and the source electrode So thereof is coupled to the signal line S4. The drain electrode Dr of the first coupling switch $SW_{C3}$ is coupled to the signal line S5, and the source electrode So thereof is coupled to the signal line S6. The first coupling switches $SW_{C1}$, $SW_{C2}$, and $SW_{C3}$ may be provided such that the source electrodes So and the drain electrodes Dr are inverted. The number of first coupling switches $SW_C$ is desirably set and is preferably the half of the number of signal lines S coupled to the first driver terminals Da.

The first switch terminal TaB is coupled to a coupling line LaB. The coupling line LaB extends to the second peripheral region B2 from a place in the outer peripheral region Bib in which it is coupled to the first switch terminal TaB through the inner peripheral region B1a and the fourth peripheral region B4 (or the third peripheral region B3) and extends in the third direction X1 in the second peripheral region B2. The coupling line LaB is coupled to the first coupling switches $SW_C$ in the second peripheral region B2. To be more specific, the coupling line LaB is coupled to the gate electrodes Ga of the first coupling switches $SW_C$. That is to say, the gate electrodes Ga of the first coupling switches $SW_C$ are coupled to the first switch terminal TaB through the coupling line LaB. The coupling line LaB is coupled to each of the gate electrodes Ga of the first coupling switches $SW_C$, in FIG. 4, each of the gate electrodes Ga of the first coupling switches $SW_{C1}$, $SW_{C2}$, and $SW_{C3}$. That is to say, one coupling line LaB is coupled to each of the first coupling switches $SW_C$.

As described above, the drain electrode Dr of each first coupling switch $SW_C$ is coupled to one of the two signal lines S coupled to the first driver terminals Da, the source electrode So thereof is coupled to the other of the two signal lines S coupled to the first driver terminals Da, and the gate electrode Ga thereof is coupled to the first switch terminal TaB through the coupling line LaB. Accordingly, when current (gate signal) is input to the gate electrodes Ga of the first coupling switches $SW_C$ through the first switch terminal TaB, the first coupling switches $SW_C$ electrically couple the two signal lines S coupled to the first driver terminals Da. On the other hand, in a state where no current (gate signal) is input to the gate electrodes Ga of the first coupling switches $SW_C$, the first coupling switches $SW_C$ electrically interrupt (disconnect) the two signal lines S coupled to the first driver terminals Da. The first coupling switches $SW_C$ are coupled to the first switch terminal TaB and the signal lines S and are configured to be capable of switching coupling and interruption of the signal lines S with the gate signal from the first switch terminal TaB, as described above.

The first inspection terminals Ta0, the first switch terminals TaA and TaB, the first inspection switches $SW_A$, and the first coupling switches $SW_C$ are configured as described above as the first inspection unit. On the other hand, the second inspection terminals Tb0, the second switch terminals TbA and TbB, the second inspection switches $SW_B$, and the second coupling switches $SW_B$ are provided so as to correspond to the signal lines S (the signal line $S_{m+1}$ to the signal line $S_n$) coupled to the second driver terminals Db and can be regarded as a second inspection unit that inspects the signal lines S coupled to the second driver terminals Db. The configuration of the second inspection unit is similar to that of the first inspection unit, and details thereof will be described below.

Some of the second inspection terminals Tb0 as the inspection terminals are provided in the second region R2, and the others of the second inspection terminals Tb0 are provided in the third region R3. In the example of FIG. 4, second inspection terminals Tb1, Tb2, Tb3, Tb4, Tb5, and Tb6 are provided in the second region R2, and second inspection terminals Tb7, Tb8, Tb9, Tb10, Tb11, and Tb12 are provided in the third region R3. The second inspection terminals Tb0 are coupled to coupling lines Lb0 as wiring. The coupling lines Lb0 extend to the inner peripheral region B1a from places in the outer peripheral region B1b in which they are coupled to the second inspection terminals Tb0 and extend in the fourth direction X2 in the inner peripheral region B1a. More specifically, the coupling lines Lb0 are coupled to both of the second inspection terminals Tb0 provided in the second region R2 and the second inspection terminals Tb0 provided in the third region R3. That is to say, in the example of FIG. 4, the second inspection terminal Tb1 and the second inspection terminal Tb7 are coupled to a coupling line Lb1, the second inspection terminal Tb2 and the second inspection terminal Tb8 are coupled to a coupling line Lb2, the second inspection terminal Tb3 and the second inspection terminal Tb9 are coupled to a coupling line Lb3, the second inspection terminal Tb4 and the second inspection terminal Tb10 are coupled to a coupling line Lb4, the second inspection terminal Tb5 and the second inspection terminal Tb11 are coupled to a coupling line Lb5, and the second inspection terminal Tb6 and the second inspection terminal Tb12 are coupled to a coupling line Lb6.

In this manner, no second inspection terminal Tb0 is provided and the first inspection terminals Ta0 are provided in the first region R1, no first inspection terminal Ta0 is provided and the second inspection terminals Tb0 are provided in the second region R2, and both of the first inspection terminals Ta0 and the second inspection terminals Tb0 are provided in the third region R3. In other words, the inspection terminals (first inspection terminals Ta0) provided in the first region R1 are coupled to the first inspection switches $SW_A$, and the inspection terminals (second inspection terminals Tb0) provided in the second region R2 are coupled to the second inspection switches $SW_B$. The first inspection terminals Ta0 coupled to the first inspection switches $SW_A$ and the second inspection terminals Tb0 coupled to the second inspection switches $SW_B$ are included in the third region R3. The first inspection terminals Ta0 are preferably provided on the first region R1 side (fourth direction X2 side) of the second inspection terminals Tb0 in the third region R3.

One of the first inspection terminals Ta0 provided in the third region R3 and one of the second inspection terminals Tb0 provided in the third region R3 are coupled to each other in the embodiment. That is to say, the coupling line La0 coupled to one of the first inspection terminals Ta0 in the third region R3 and the coupling line Lb0 coupled to one of the second inspection terminals Tb0 in the third region R3 are coupled to each other. The coupling line La1 coupled to the first inspection terminal Ta7 and the coupling line Lb1 coupled to the second inspection terminal Tb7 are coupled to each other in FIG. 4. Similarly, the coupling line La2 and the coupling line Lb2 are coupled to each other, the coupling line La3 and the coupling line Lb3 are coupled to each other, the coupling line La4 and the coupling line Lb4 are coupled to each other, the coupling line La5 and the coupling line Lb5 are coupled to each other, and the coupling line La6 and the coupling line Lb6 are coupled to each other. That is to say, all of the coupling lines La0 and the coupling lines Lb0, in other words, all of the first inspection terminals Ta0 and the second inspection terminals Tb0 provided in the third region R3 are coupled to each other in pairs in FIG. 4. The first inspection terminals Ta0 provided in the third region R3 and the second inspection terminals Tb0 provided in the third region R3, that is, the coupling lines La0 and the coupling lines Lb0 may not be coupled to each other.

A plurality of the second inspection switches $SW_B$ are provided. The second inspection switches $SW_B$ are provided in the first peripheral region B1 and are provided on the display region A side of the second driver terminals Db (the second direction Y2 side of the second driver terminals Db) in the first peripheral region B1. The second inspection switches $SW_B$ are provided in the inner peripheral region B1a in the embodiment. More specifically, the second inspection switches $SW_B$ may be provided at positions superimposing with the color filter layer CF when seen from the direction Z in the inner peripheral region B1a in which the first substrate SUB1 and the second substrate SUB2 are superimposed with each other. Furthermore, the second inspection switches $SW_B$ may be provided between the second region R2 and the third region R3 in the direction X.

The second inspection switches $SW_B$ are coupled to the coupling lines Lb0 and the video lines Vb. That is to say, the second inspection switches $SW_B$ are coupled to the second inspection terminals Tb0 through the coupling lines Lb0. The second inspection switches $SW_B$ are coupled to the signal lines S (any of the signal line $S_{m+1}$ to the signal line $S_n$) coupled to the second inspection switches $SW_B$ through the video lines Vb and are also regarded as being coupled to the second driver terminals Db through the video lines Vb. To be specific, the drain electrodes Dr of the second inspection switches $SW_B$ are coupled to the second inspection terminals Tb0 through the coupling lines Lb0. The source electrodes So of the second inspection switches $SW_B$ are coupled to the signal lines S (any of the signal line $S_{m+1}$ to the signal line $S_n$) coupled to the second driver terminals Db and the second driver terminals Db through the video lines Vb. The number of second inspection switches $SW_B$ is desirably set and is preferably the same as the number of signal lines S coupled to the second driver terminals Db.

The second inspection terminals Tb0 in the second region R2 and the second inspection terminals Tb0 in the third region R3 are coupled to the coupling lines Lb0. Accordingly, the second inspection switches $SW_B$ are regarded as being coupled to the second inspection terminals Tb0 in the second region R2 and the second inspection terminals Tb0 in the third region R3 through the coupling lines Lb0. Coupling places of the second inspection switches $SW_B$ to the coupling lines Lb0 are located between coupling places of the second inspection terminals Tb0 provided in the second region R2 to the coupling lines Lb0 and coupling places of the second inspection terminals Tb0 provided in the third region R3 to the coupling lines Lb0. That is to say, the coupling places of the second inspection switches $SW_B$ to the coupling lines Lb0 are located on the fourth direction X2 side of the coupling places of the second inspection terminals Tb0 provided in the second region R2 to the coupling lines Lb0 and on the third direction X1 side of the coupling places of the second inspection terminals Tb0 provided in the third region R3 to the coupling lines Lb0.

The second switch terminal TbA is coupled to a coupling line LbA. The coupling line LbA extends to the inner peripheral region B1$a$ from a place in the outer peripheral region B1$b$ in which it is coupled to the second switch terminal TbA and extends in the fourth direction X2 in the inner peripheral region B1$a$. The coupling line LbA is coupled to the second inspection switches $SW_B$ in the inner peripheral region B1$a$. To be more specific, the coupling line LbA is coupled to the gate electrodes Ga of the second inspection switches $SW_B$. That is to say, the gate electrodes Ga of the second inspection switches $SW_B$ are coupled to the second switch terminal TbA through the coupling line LbA. The coupling line LaA is coupled to each of the gate electrodes Ga of the second inspection switches $SW_B$. That is to say, one coupling line LbA is coupled to each of the second inspection switches $SW_B$. Although the coupling line LbA and the coupling line LaA are not coupled to each other in the embodiment, they may be coupled to each other. In this case, only one of the first switch terminal TaA and the second switch terminal TbA may be provided.

When current (gate signal) is input to the gate electrodes Ga of the second inspection switches $SW_B$ through the second switch terminal TbA, the second inspection switches $SW_B$ electrically couple the coupling lines Lb0 and the video lines Vb, that is, the second inspection terminals Tb0 and the signal lines S (any of the signal line $S_{m+1}$ to the signal line $S_n$) coupled to the second driver terminals Db. On the other hand, in a state where no current (gate signal) is input to the gate electrodes Ga of the second inspection switches $SW_B$, the second inspection switches $SW_B$ electrically interrupt (disconnect) the coupling lines Lb0 and the video lines Vb, that is, the second inspection terminals Tb0 and the signal lines S coupled to the second driver terminals Db. The second inspection switches $SW_B$ are thus configured to be capable of switching coupling and interruption of the second inspection terminals Tb0 and the signal lines S. More specifically, the second inspection switches $SW_B$ switch coupling and interruption of the second inspection terminals Tb0 and the signal lines S with the gate signal from the second switch terminal TbA.

The second coupling switches $SW_D$ as the coupling switches are provided in the second peripheral region B2. That is to say, the second coupling switches $SW_D$ are provided on the second direction Y2 side of the second inspection switches $SW_B$ provided in the first peripheral region B1 and the signal lines S provided in the display region A. Each second coupling switch $SW_D$ is coupled to the signal lines S coupled to the second driver terminals Db, and in the embodiment, it is coupled to two signal lines S (two of the signal line $S_{m+1}$ to the signal line $S_n$) coupled to the second driver terminals Db. To be specific, the drain electrode Dr of each second coupling switch $SW_D$ is coupled to one signal line S of the two signal lines S coupled to the second driver terminals Db, and the source electrode So thereof is coupled to the other signal line S of the two signal lines S coupled to the second driver terminals Db. The second coupling switches $SW_D$ are preferably coupled to end portions of the signal lines S on the second direction Y2 side. The number of second coupling switches $SW_D$ is desirably set and is preferably the half of the number of signal lines S coupled to the second driver terminals Db.

The second switch terminal TbB is coupled to a coupling line LbB. The coupling line LbB extends to the second peripheral region B2 from a place in the outer peripheral region B1$b$ in which it is coupled to the second switch terminal TbB through the inner peripheral region B1$a$ and the third peripheral region B3 (or the fourth peripheral region B4) and extends in the fourth direction X2 in the second peripheral region B2. The coupling line LbB is coupled to the second coupling switches $SW_D$ in the second peripheral region B2. To be more specific, the coupling line LbB is coupled to the gate electrodes Ga of the second coupling switches $SW_D$. That is to say, the gate electrodes Ga of the second coupling switches $SW_D$ are coupled to the second switch terminal TbB through the coupling line LbB. The coupling line LbB is coupled to each of the gate electrodes Ga of the second coupling switches $SW_D$. That is to say, one coupling line LbB is coupled to each of the second coupling switches $SW_D$. Although the coupling line LbB and the coupling line LaB are not coupled to each other in the embodiment, they may be coupled to each other. In this case, only one of the first switch terminal TaB and the second switch terminal TbB may be provided.

When current (gate signal) is input to the gate electrodes Ga of the second coupling switches $SW_D$ through the second switch terminal TbB, the second coupling switches $SW_D$ electrically couple the two signal lines S coupled to the second driver terminals Db. On the other hand, in a state where no current (gate signal) is input to the gate electrodes Ga, the second coupling switches $SW_D$ electrically interrupt (disconnect) the two signal lines S coupled to the second driver terminals Db. The second coupling switches $SW_D$ are coupled to the second switch terminal TbB and the signal lines S and are configured to be capable of switching coupling and interruption of the signal lines S with the gate signal from the second switch terminal TbB, as described above.

Inspection Method

Figure 5:
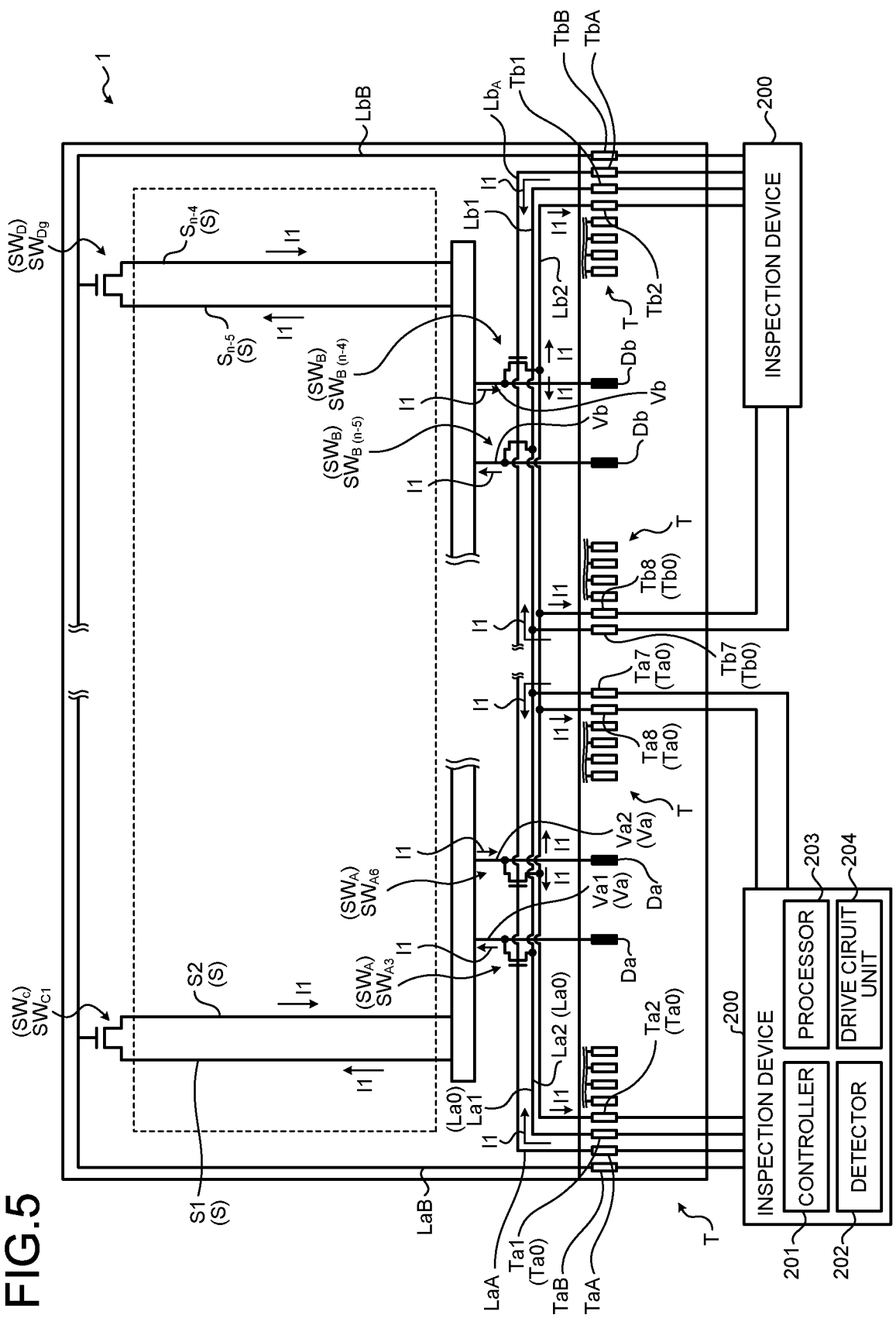
FIG. 5 is a schematic view illustrating an example of aging processing.

The display device 1 has the above-mentioned configuration. Next, a method for inspecting the wiring of the display device 1, that is, the aging processing and the lighting inspection will be described. FIG. 5 is a schematic view illustrating an example of the aging processing. When the aging processing is performed, the driver ICs 110$a$ and 110$b$ are not coupled to the first driver terminals Da and the second driver terminals Db, and signals from the driver ICs 110$a$ and 110$b$ are not input to the first driver terminals Da and the second driver terminals Db. The driver ICs 110$a$ and 110$b$ may however be coupled to the first driver terminals Da and the second driver terminals Db as long as no signal from the driver ICs 110$a$ and 110$b$ is input to the first driver terminals Da and the second driver terminals Db.

FIG. 5 illustrates an example when the aging processing is performed on the signal lines S1, S2, $S_{n-5}$, and $S_{n-4}$ for the convenience of explanation. As illustrated in FIG. 5, inspection devices 200 are coupled to the inspection terminals T when the aging processing is performed. Each inspection device 200 includes a controller 201, a detector 202, a processor 203, and a drive circuit 204. The inspection devices 200 are merely an example and may not have some of these functions and may have another function. The driver ICs 110$a$ and 110$b$ (see FIG. 1) may have some of the functions of the inspection devices 200.

The controller 201 is a circuit configured to control the detector 202, the processor 203, and the drive circuit 204 and inspect the display device 1. The detector 202 is a circuit configured to detect signals (in this example, current I1) output from the signal lines S. The detector 202 is, for example, a voltage detection circuit or a current detection circuit. The processor 203 is a determination circuit configured to determine short-circuit, disconnection, and the like of the signal lines S based on detection signals of the detector 202. The drive circuit 204 generates the gate signals for driving the switches and inspection signals for causing the current I1 to flow through the signal lines S and outputs them to the display device 1.

Hereinafter, the case in which the aging processing is performed on the signal lines S1 and S2 will be described. The inspection device 200 outputs the gate signals to the first switch terminal TaA and the first switch terminal TaB from the drive circuit 204. The gate signals are current having a predetermined potential, and the potential is preferably a fixed potential that is constant. The inspection device 200 continuously outputs the gate signals to the first switch terminal TaA and the first switch terminal TaB for a predetermined period, that is, a period in which the aging processing is performed. The gate signal output to the first switch terminal TaA is input to the gate electrodes Ga of the first inspection switches $SW_A$ through the coupling line LaA. The first inspection switches $SW_A$ couple the coupling lines La0 and the video lines Va, that is, the first inspection terminals Ta0 and the signal lines S coupled to the first driver terminals Da when the gate signal is input to the gate electrodes Ga of the first inspection switches $SW_A$. That is to say, the first inspection switch $SW_{A3}$ couples the coupling line La1 and the video line Va1, and the first inspection switch $SW_{A6}$ couples the coupling line La2 and the video line Va2 in the example of FIG. 5. On the other hand, the gate signal output to the first switch terminal TaB is input to the gate electrodes Ga of the first coupling switches $SW_C$ through the coupling line LaB. The first coupling switches $SW_C$ couple the signal lines S coupled to the first driver terminals Da, in the example of FIG. 5, the signal line S1 and the signal line S2 when the gate signal is input to the gate electrodes Ga of the first coupling switches $SW_C$. A closed circuit is thereby formed by the inspection device 200, the first inspection terminal Ta1, the coupling line La1, the first inspection switch $SW_{A3}$, the video line Va1, the signal line S1, the first coupling switch $SW_{C1}$, the signal line S2, the video line Va2, the first inspection switch $SW_{A6}$, the coupling line La2, and the first inspection terminal Ta2.

The inspection device 200 outputs the inspection signals to the first inspection terminals Ta0 in the first region R1 and the first inspection terminals Ta0 in the third region R3 from the drive circuit 204. The inspection signals are current having a predetermined potential. The inspection device 200 outputs the inspection signals having different potentials to the first inspection terminals Ta0 forming pairs. The inspection device 200 preferably outputs the inspection signals having potentials of opposite polarities to the first inspection terminals Ta0 forming the pairs. The first inspection terminals Ta0 forming the pair indicate two first inspection terminals Ta0 coupled to two signal lines S to which the same first coupling switch $SW_C$ is coupled. The first inspection terminal Ta1 and the first inspection terminal Ta2 and the first inspection terminal Ta7 and the first inspection terminal Ta8 are the first inspection terminals Ta0 forming the pairs in the example of FIG. 5. The inspection device 200 outputs the inspection signals having potentials of the positive polarity to the first inspection terminal Ta1 and the first inspection terminal Ta7 and outputs the inspection signals having potentials of the negative polarity to the first inspection terminal Ta2 and the first inspection terminal Ta8 in the example of FIG. 5. The closed circuit is formed as described above, so that the current I1 flows through the coupling line La1, the first inspection switch $SW_{A3}$, the video line Va1, the signal line S1, the first coupling switch $SW_{C1}$, the signal line S2, the video line Va2, the first inspection switch $SW_{A6}$, the coupling line La2, and the first inspection terminal Ta2 and the first inspection terminal Ta8 in this order from the first inspection terminal Ta4 and the first inspection terminal Ta7 with potential difference between the inspection signals in the first inspection terminals Ta0 forming the pairs. That is to say, the inspection device 200 supplies the current to the signal lines S from both of the first inspection terminals Ta0 in the first region R1 and the first inspection terminals Ta0 in the third region R3. The inspection device 200 sets the potential difference between the first inspection terminals Ta to be as high as for example, several tens of volts to cause the current I1 of a high voltage to flow. The voltage value of the current I1 is set to be at least higher than voltages of the video image signals from the driver IC 110. The inspection device 200 may switch the polarities of the inspection signals that are output to the first inspection terminals Ta every time predetermined time elapses. The direction of the current I1 can thereby be reversed every predetermined time.

In the aging processing illustrated in FIG. 5, when a sub-disconnected portion of the signal line S, that is, a portion where the line width is locally narrowed is formed, the portion can be disconnected by causing the current I1 to flow through the signal line S1 and the signal line S2 as described above. By breaking a product before shipping and detecting the breakage, it is possible to prevent disconnection after shipping and improve reliability. When the signal line S is disconnected in the aging processing, no current flows therethrough. The detector 202 and the processor 203 therefore detect that no current or voltage flows, thereby detecting the disconnection of the signal line S. For example, when lighting inspection signals are output to the signal lines S in the lighting inspection or the like after the aging processing, the disconnected portion is not displayed in color. Detection of it in the lighting inspection, which will be described later, therefore enables the disconnection of the signal line S to be detected. Whether there is a sub-disconnected portion in the signal lines S can be detected by thus performing the aging processing illustrated in FIG. 5. In the aging processing illustrated in FIG. 5, the current I1 flows also through sections of the video lines Va from the first inspection switches $SW_A$ to the coupling circuit MU. Accordingly, it can be detected whether there is a sub-disconnected portion for the video lines Va in addition to the signal lines S.

The detection devices 200 perform similar processing on all of the signal lines 5, so that the aging processing is performed on all of the signal lines S. The detection device 200 causes the current I1 to flow through the coupling line Lb1, the second inspection switch $SW_{C(n-5)}$, the video line Vb, the signal line $S_{n-5}$, the second coupling switch $SW_{Dq}$, the signal line $S_{n-4}$, the video line Vb, the second inspection switch $SW_{B(n-4)}$, the coupling line Lb, and the second inspection terminal Tb2 and the second inspection terminal Tb8 in this order from the second inspection terminal Tb1 and the second inspection terminal Tb7, as illustrated in FIG. 5.

Figure 6:
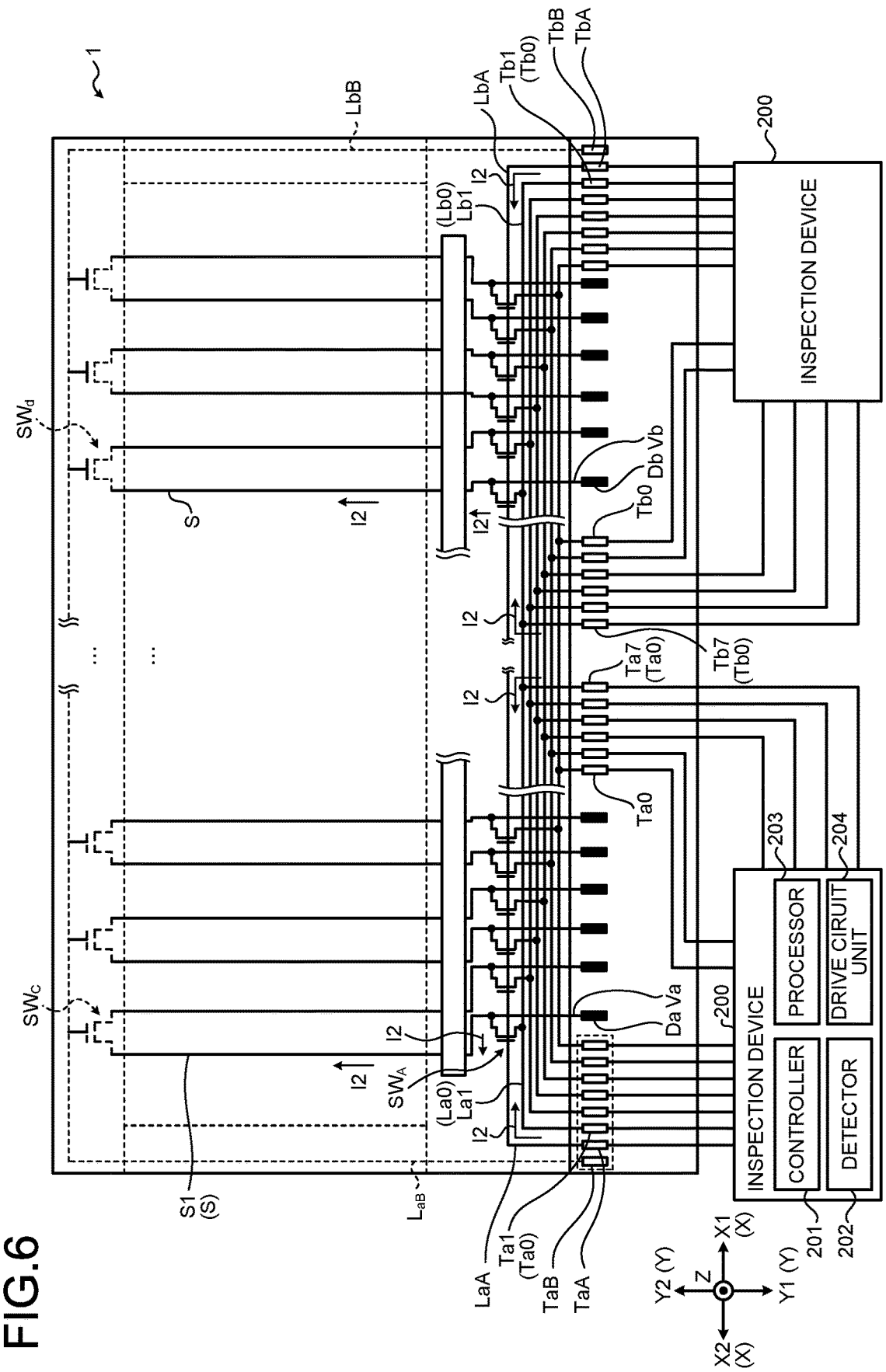
FIG. 6 is a schematic view illustrating an example of lighting inspection.

Next, the lighting inspection is described. FIG. 6 is a schematic view illustrating an example of the lighting inspection. The lighting inspection is preferably performed after the aging processing. As illustrated in FIG. 6, the inspection device 200 outputs the gate signal to the first switch terminal TaA from the drive circuit 204 but it outputs no gate signal to the first switch terminal TaB in the lighting inspection. Accordingly, the inspection device 200, the first inspection terminals Ta0, the coupling lines La0, the first inspection switches SW$_A$, the video lines Va, and the signal lines S are electrically coupled to one another, and the signal lines S are not electrically coupled to each other. The inspection device 200 outputs current I2 as the lighting inspection signals to the first inspection terminals Ta0 in the first region R1 and the first inspection terminals Ta0 in the third region R3 from the drive circuit 204 in this state. The current I2 flows through the coupling lines La0, the first inspection switches SW$_A$, the video lines Va, and the signal lines S and is output to the pixels PX coupled to the signal lines S. The pixels PX are lightened with the current I2. The current I2 is current having a predetermined potential, and the potential is preferably a fixed potential that is constant. A voltage value (current value) of the current I2 is equivalent to the voltage values (current values) of the video image signals and is lower than the voltage value (current value) of the inspection signal of the aging processing. Although the lighting inspection is performed using the same inspection devices 200 that are used for the aging processing in FIG. 6, different inspection devices may be used.

In the lighting inspection illustrated in FIG. 6, the inspection devices 200 perform similar processing on all of the signal lines S to output the current I2 as the lighting inspection signals to all of the signal lines S. For example, the inspection device 200 outputs the current I2 also to the pixels PX coupled to the signal lines S through the coupling lines Lb0, the second inspection switches SW$_B$, the video lines VB, and the signal lines S, as illustrated in FIG. 6. Whether the signal lines S are in normal states, that is, the signal lines S are not disconnected, and so on is inspected based on the lighting states of the pixels PX, for example, in the lighting inspection. For example, when the lighting inspection signals having the same potential are output to all of the pixels PX, the entire screen is made into the same color. When there is however a place in a different color, it is determined that the signal line S corresponding to the place has abnormality.

When a plurality of the inspection switches are provided, the inspection switches on the farther side from the inspection terminals have longer paths through which the current flows and the resistances thereof are accumulated and increased. The less current flows through the inspection switches on the farther side from the inspection terminals, that is, through the signal lines S farther from the inspection terminals, resulting in a risk of imbalance in the current flowing through the signal lines S. The path through which the current flows is different between the first inspection switches SW$_A$ and the second inspection switches SW$_B$. Deviation of the current among the signal lines S can therefore become more significant when the first inspection switches SW$_A$ and the second inspection switches SW$_B$ are provided, that is, the driver ICs 110 are provided. When the current is thus deviated among the signal lines S, for example, the signal line S that is sub-disconnected cannot be possibly disconnected properly in the aging processing. In the lighting inspection, even when the signal line S is actually normal, the colors of the pixels PX are changed due to different current values to the pixels PX, and erroneous detection that the signal line S has abnormality can occur. The imbalance of the current among the signal lines S in the inspection lowers the inspection accuracy, as described above. To cope with this, the display device 1 in the embodiment includes the first inspection terminals Ta0 on both sides of the first inspection switches SW$_A$, that is, in the first region R1 and the third region R3 and includes the second inspection terminals Tb0 on both sides of the second inspection switches SW$_B$, that is, in the second region R2 and the third region R3. Accordingly, the current can be supplied to the first inspection switches SW$_A$ from both sides including the first region R1 and the third region R3, and the current can be supplied to the second inspection switches SW$_B$ from both sides including the second region R2 and the third region R3. The power can therefore be supplied from both sides to the signal lines S coupled to the first inspection switches SW$_A$ and the second inspection switches SW$_B$, so that lowering of the current value can be prevented and deviation of the current among the signal lines S can be prevented. The display device 1 can therefore prevent the inspection accuracy and reliability from being lowered.

The first inspection terminals Ta0 coupled to the first inspection switches SW$_A$ and the second inspection terminals Tb0 coupled to the second inspection switches SW$_B$ are included in the third region in the embodiment. Any of the first inspection terminals Ta0 and the second inspection terminals Tb0 may not be included in the third region. That is to say, the second inspection terminals Tb0 may not be provided in the third region, and in this case, the first inspection terminals Ta0 in the third region are coupled to the first inspection switches SW$_A$ through the coupling lines La0 and are coupled also to the second inspection switches SW$_B$ through the coupling lines Lb0. It is thus sufficient that the inspection terminals provided in the third region are coupled to at least one of the first inspection switches SW$_A$ and the second inspection switches SW$_B$.

As described above, the display device 1 in the embodiment includes the first substrate SUB1, the signal lines S (wiring), the first driver terminals Da, the second driver terminals Db, the inspection terminals (the first inspection terminals Ta0 and the second inspection terminals Tb0) provided in the first peripheral region B1, the first inspection switches SW$_A$, and the second inspection switches SW$_B$. The first substrate SUB1 has the display region A in which the pixels PX are provided and the peripheral region B on the outer side of the display region A. The signal lines S are provided in the display region A and are coupled to the pixels PC to supply the video image signals to the pixels PX. The first driver terminals Da are terminals that are provided in the first peripheral region B1 on the third direction X1 side of the display region A and are coupled to the signal lines S and to which the driver IC 110a (first driver IC) can be coupled. The second driver terminals Db are terminals that are provided at positions aligned with in the direction intersecting with the first direction Y1 (in this example, the direction X) in the first peripheral region B1 and are coupled to the signal lines S and to which the driver IC 110b (second driver IC) can be coupled. The first inspection switches SW$_A$ are coupled to the first driver terminals Da and are configured to be capable of switching coupling and interruption of the inspection terminals and the signal lines S. The second inspection switches SW$_B$ are coupled to the second driver terminals Db and are configured to be capable of switching coupling and interruption of the inspection terminals and the signal lines S. The inspection terminals are provided in the first region R1 on the side of the first driver terminals Da that is opposite to the side of the second driver terminals Db, the second region R2 on the side of the second driver terminals Db that is opposite to the side of the first driver terminals Da, and the third region R3 between the first driver terminals Da and the second driver terminals Db.

The display device 1 in the embodiment includes the inspection terminals in the first region R1, the second region R2, and the third region R3. Accordingly, both-side power supply from these inspection terminals can be performed in the inspection of the signal lines S to prevent the imbalance of the current value among the signal lines S, thereby preventing the inspection accuracy and reliability from being lowered.

The inspection terminals (first inspection terminals Ta0) provided in the first region R1 are coupled to the first inspection switches $SW_A$, the inspection terminals (second inspection terminals Tb0) provided in the second region R2 are coupled to the second inspection switches $SW_B$, and the inspection terminals provided in the third region are coupled to at least one of the first inspection switches $SW_A$ and the second inspection switches $SW_B$. The display device 1 can supply power to the first inspection switches $SW_A$ from both sides by providing the first inspection terminals Ta0 in the first region R1 and the third region R3 on both sides of the first inspection switches $SW_A$. Similarly, the display device 1 can supply power to the second inspection switches $SW_B$ from both sides. The display device 1 can therefore prevent the imbalance of the current value among the signal lines S, thereby preventing the reliability from being lowered.

The first inspection terminals Ta0 coupled to the first inspection switches $SW_A$ and the second inspection terminals Tb0 coupled to the second inspection switches $SW_B$ are included in the third region R3. The display device 1 can supply the current from both sides to the first inspection switches $SW_A$ and the second inspection switches $SW_B$, so that the imbalance of the current value among the signal lines S can be prevented, thereby preventing the reliability from being lowered.

The first inspection terminals Ta0 coupled to the first inspection switches $SW_A$ in the third region R3 and the second inspection terminals Tb0 coupled to the second inspection switches $SW_B$ in the third region R3 are coupled to each other. The display device 1 can prevent imbalance of the voltage between the first inspection switches $SW_A$ and the second inspection switches $SW_B$ by coupling the first inspection terminals Ta0 and the second inspection terminals Tb0, thereby preventing the reliability from being lowered.

The display device 1 further includes the first switch terminal TaA provided in the first peripheral region B1 and coupled to the first inspection switches $SW_A$ and the second switch terminal TbA provided in the first peripheral region B1 and coupled to the second inspection switches $SW_B$. The first inspection switches $SW_A$ switch coupling and interruption of the first inspection terminals Ta0 and the signal lines S with the gate signal from the first switch terminal TaA, and the second inspection switches $SW_B$ switch coupling and interruption of the second inspection terminals Tb0 and the signal lines S with the gate signal from the second switch terminal TbA. The display device 1 couples the signal lines S and the inspection terminals by the first inspection switches $SW_A$ and the second inspection switches $SW_B$, thereby preferably inspecting the signal lines S.

The first inspection switches $SW_A$ and the second inspection switches $SW_B$ are provided in the first peripheral region B1. The first inspection switches $SW_A$ and the second inspection switches $SW_B$ are respectively provided on the sides of the first driver terminals Da and the second driver terminals Db, thereby preferably inspecting the signal lines S.

The display device 1 further includes the coupling switches (the first coupling switches $SW_C$ and the second coupling switches $SW_D$). The coupling switches are provided in the second peripheral region B2 and are configured to be capable of switching coupling and interruption of the signal lines S. The display device 1 includes the coupling switches capable of coupling the signal lines S, so that the aging processing can be preferably performed.

Modifications

Next, modifications are described. The display device 1 in the above-mentioned embodiment employs the COF mounting with which the driver IC 110 is mounted on the wiring substrate 101. The driver IC 110 is not limited to be mounted by the COF mounting and may be provided on the first substrate SUB1, that is, mounted by chip on glass (COG) mounting as illustrated in a display device 1A according to a modification. Although the display device 1A in the modification will be described hereinafter, explanation of parts having common configurations to those of the display device 1 in the embodiment will be omitted.

FIG. 7 is a plan view schematically illustrating the display device in the modification. As illustrated in FIG. 7, the display device 1A in the modification includes a driver IC 110Aa, a driver IC 110Ab, a wiring substrate 102a, and a wiring substrate 102b provided in the outer peripheral region Bib of the first peripheral region B1. The inspection terminals T, the first driver terminals Da, the second driver terminals Db, first input terminals Ea, second input terminals Eb, first wiring terminals Fa, and second wiring terminals Fb are provided in the outer peripheral region B1b.

The first wiring terminals Fa are provided and are coupled to the wiring substrate 102a. The first input terminals Ea are provided and are coupled to the first wiring terminals Fa and the driver IC 110Aa. The first driver terminals Da are coupled to the driver IC 110Aa. Signals from the wiring substrate 102a are input to the driver IC 110Aa through the first wiring terminals Fa and the first input terminals Ea. The driver IC 110Aa generates video image signals based on the signals from the wiring substrate 102a, and the video image signals are output to the signal lines S through the first driver terminals Da.

The second wiring terminals Fb are provided and are coupled to the wiring substrate 102b. The second input terminals Eb are provided and are coupled to the second wiring terminals Fb and the driver IC 110Ab. The second driver terminals Db are coupled to the driver IC 110Ab. Signals from the wiring substrate 102b are input to the driver IC 110Ab through the second wiring terminals Fb and the second input terminals Eb. The driver IC 110Ab generates video image signals based on the signals from the wiring substrate 102b, and the video image signals are output to the signal lines S through the second driver terminals Db.

Figure 8:
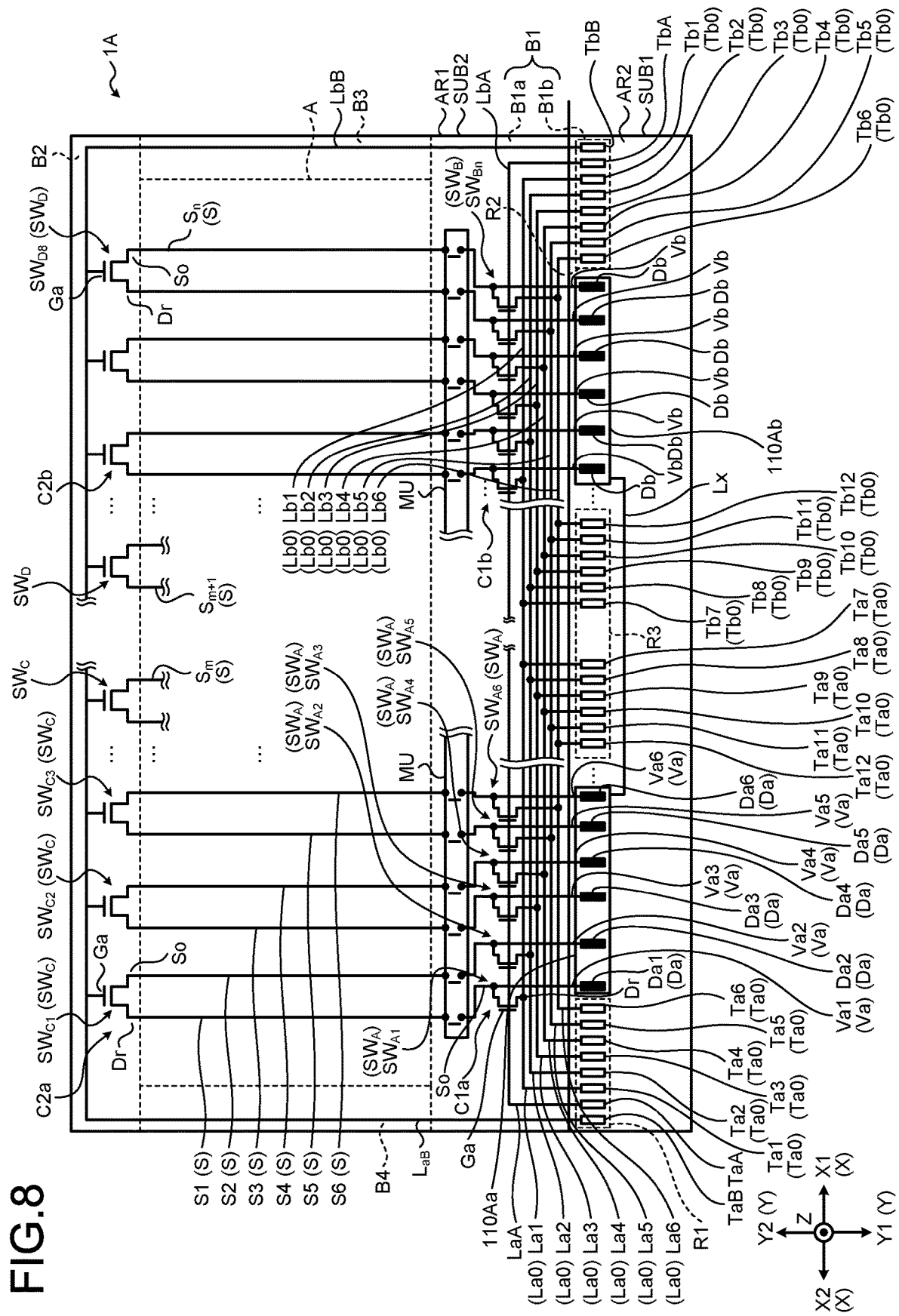
FIG. 8 is a schematic circuit diagram of the configuration of the display device in the modification.

FIG. 8 is a schematic circuit diagram of the configuration of the display device in the modification. As illustrated in FIG. 8, the circuit configuration for inspecting the signal lines S in the display device 1A in the modification is similar to the circuit configuration in the embodiment illustrated in FIG. 4. The driver IC 110Aa and the drive IC 110Ab are preferably coupled to each other through wiring Lx provided in the outer peripheral region B1b, as illustrated in FIG. 8. The wiring Lx extends in the outer peripheral region B1b so as not to make contact with the first inspection terminals Ta0 and the second inspection terminals Tb0 provided in the third region R3. For example, the wiring Lx preferably extends on the first direction Y1 side of the first inspection terminals Ta0 and the second inspection terminals Tb0 provided in the third region R3. Noise interference between the display device 1 and the driver ICs, and the like can be prevented by coupling the driver ICs 110Aa and 110Ab through the wiring Lx as described above. The driver IC 110Aa and the drive IC 110Ab may not be coupled to each other.

FIG. 9 is a plan view schematically illustrating a display device according to another modification. In FIG. 7, the first inspection circuit C1a and the second inspection circuit C1b, that is, the first inspection switches $SW_A$ and the second inspection switches $SW_B$ are provided in the inner peripheral region B1a similarly to the embodiment in FIG. 1. In the COG mounting, the first inspection circuit C1a and the second inspection circuit C1b, that is, the first inspection switches $SW_A$ and the second inspection switches $SW_B$ may be arranged in the outer peripheral region B1b as illustrated in FIG. 9. In this case, the first inspection circuit C1a, that is, the first inspection switches $SW_A$ are preferably provided on the lower side of the driver IC 110Aa in the Z direction. Similarly, the second inspection circuit C1b, that is, the second inspection switches $SW_B$ are preferably provided on the lower side of the driver IC 110Ab in the Z direction. Such arrangement causes the first inspection switches $SW_A$ and the second inspection switches $SW_B$ to be covered by the driver ICs 110Aa and 110Ab to prevent exposure of the first inspection switches $SW_A$ and the second inspection switches $SW_B$ even when the first inspection switches $SW_A$ and the second inspection switches $SW_B$ are arranged in the outer peripheral region B1b. The lower side in the Z direction indicates the first substrate SUB1 side when the first substrate SUB1 and the second substrate SUB2 are superimposed with each other in the Z direction.

Other action effects provided by the aspect described in the embodiment that are obvious from description of the present specification or at which those skilled in the art can appropriately arrive should be interpreted to be provided by the present disclosure.

What is claimed is:

1. A display device comprising:
    a first substrate having a display region in which a plurality of pixels are provided and a peripheral region on an outer side of the display region;
    wiring provided in the display region and coupled to the pixels to supply a signal to the pixels;
    a first driver terminal that is provided in a first peripheral region being the peripheral region on a first direction side of the display region and is coupled to the wiring and to which a first driver IC is capable of being coupled;
    a second driver terminal that is provided at a position aligned with the first driver terminal in a direction intersecting with the first direction in the first peripheral region and is coupled to the wiring and to which a second driver IC is capable of being coupled;
    a plurality of inspection terminals provided in the first peripheral region;
    a first inspection switch coupled to the first driver terminal and configured to be capable of switching coupling and interruption of the inspection terminal and the wiring; and
    a second inspection switch coupled to the second driver terminal and configured to be capable of switching coupling and interruption of the inspection terminal and the wiring, wherein
    the inspection terminals are provided in a first region on a side of the first driver terminal that is opposite to a side of the second driver terminal, a second region on a side of the second driver terminal that is opposite to the side of the first driver terminal, and a third region between the first driver terminal and the second driver terminal.

2. The display device according to claim 1, wherein
    the inspection terminal provided in the first region is coupled to the first inspection switch,
    the inspection terminal provided in the second region is coupled to the second inspection switch, and
    the inspection terminal arranged in the third region is coupled to at least one of the first inspection switch and the second inspection switch.

3. The display device according to claim 2, wherein the inspection terminal coupled to the first inspection switch and the inspection terminal coupled to the second inspection switch are included in the third region.

4. The display device according to claim 3, wherein the inspection terminal coupled to the first inspection switch in the third region and the inspection terminal coupled to the second inspection switch in the third region are coupled to each other.

5. The display device according to claim 1, further comprising a first switch terminal provided in the first peripheral region and coupled to the first inspection switch and a second switch terminal provided in the first peripheral region and coupled to the second inspection switch, wherein
    the first inspection switch switches coupling and interruption of the inspection terminal and the wiring with a signal from the first switch terminal, and the second inspection switch switches coupling and interruption of the inspection terminal and the wiring with a signal from the second switch terminal.

6. The display device according to claim 1, wherein the first inspection switch and the second inspection switch are provided in the first peripheral region.

7. The display device according to claim 6, further comprising a coupling switch provided in a second peripheral region being the peripheral region on a side of the display device that is an opposite direction side to the first direction and configured to be capable of switching coupling and interruption of a plurality of lines of the wiring.

* * * * *